US008237282B2

(12) United States Patent
Okuda et al.

(10) Patent No.: US 8,237,282 B2
(45) Date of Patent: Aug. 7, 2012

(54) SEMICONDUCTOR DEVICE

(75) Inventors: Takashi Okuda, Hyogo (JP); Yasuo Morimoto, Hyogo (JP); Yuko Maruyama, Hyogo (JP); Toshio Kumamoto, Hyogo (JP)

(73) Assignees: Renesas Electronics Corporation, Kawasaki-shi (JP); Renesas Device Design Corp., Itami-shi (JP)

( * ) Notice: Subject to any disclaimer, the term of this patent is extended or adjusted under 35 U.S.C. 154(b) by 0 days.

(21) Appl. No.: 13/030,861

(22) Filed: Feb. 18, 2011

(65) Prior Publication Data

US 2011/0140277 A1  Jun. 16, 2011

Related U.S. Application Data

(63) Continuation of application No. 12/485,528, filed on Jun. 16, 2009, now Pat. No. 7,915,708, which is a continuation of application No. 11/845,339, filed on Aug. 27, 2007, now Pat. No. 7,557,427, which is a continuation of application No. 11/013,514, filed on Dec. 17, 2004, now Pat. No. 7,276,776.

(30) Foreign Application Priority Data

Jan. 6, 2004  (JP) .................................. 2004-000976

(51) Int. Cl.
*H01L 23/522* (2006.01)
(52) U.S. Cl. ........ 257/758; 257/532; 257/534; 257/535; 257/E29.343; 257/E23.144; 257/E23.145
(58) Field of Classification Search .................. 257/532, 257/758, 534, 535, E29.343, E23.144, E23.145
See application file for complete search history.

(56) References Cited

U.S. PATENT DOCUMENTS

| 5,237,235 A | 8/1993 | Cho et al. |
| 5,583,359 A * | 12/1996 | Ng et al. ........................ 257/306 |
| 5,877,533 A | 3/1999 | Arai et al. |
| 7,446,390 B2 | 11/2008 | Okuda et al. |
| 2002/0020917 A1 | 2/2002 | Hirota et al. |

FOREIGN PATENT DOCUMENTS

| JP | 2001-177056 | 6/2001 |
| JP | 2001-196536 | 7/2001 |
| JP | 2002-100732 | 4/2002 |
| JP | 2003-152085 | 5/2003 |
| JP | 2005-108874 | 4/2005 |

OTHER PUBLICATIONS

Roberto Aparicio, et al., "Capacity Limits and Matching Properties of Integrated Capacitors", IEEE Journal of Solid-State Circuits, vol. 37, No. 3, Mar. 2002, pp. 384-393.

* cited by examiner

*Primary Examiner* — Tom Thomas
*Assistant Examiner* — Benjamin Tzu-Hung Liu
(74) *Attorney, Agent, or Firm* — Oblon, Spivak, McClelland, Maier & Neustadt, L.L.P.

(57) ABSTRACT

A semiconductor device includes a semiconductor substrate including a main surface; a plurality of first interconnections formed in a capacitance forming region defined on the main surface and extending in a predetermined direction; a plurality of second interconnections each adjacent to the first interconnection located at an edge of the capacitance forming region, extending in the predetermined direction, and having a fixed potential; and an insulating layer formed on the main surface and filling in between each of the first interconnections and between the first interconnection and the second interconnection adjacent to each other. The first interconnections and the second interconnections are located at substantially equal intervals in a plane parallel to the main surface, and located to align in a direction substantially perpendicular to the predetermined direction.

20 Claims, 16 Drawing Sheets

SEMICONDUCTOR DEVICE

CROSS-REFERENCE TO PRIORITY APPLICATIONS

The present application is a continuation of U.S. application Ser. No. 12/485,528 filed on Jun. 16, 2009, which is a continuation of U.S. application Ser. No. 11/845,339 filed Aug. 27, 2007, which is a continuation of U.S. application Ser. No. 11/013,514 filed on Dec. 17, 2004, and in turn claims priority to JP 2004-000976 filed on Jan. 6, 2004, the entire contents of each of which are hereby incorporated herein by reference.

BACKGROUND OF THE INVENTION

1. Field of the Invention

The present invention relates to a semiconductor device, and more particularly, to a semiconductor device having a capacitive element utilizing an interconnection layer.

2. Description of the Background Art

Recently, capacitive elements utilizing a parasitic capacitance between interconnections have started to be used along with process miniaturization. A semiconductor integrated circuit device having such a capacitive element is disclosed for example in Japanese Patent Laying-Open No. 2001-177056. The semiconductor integrated circuit device disclosed in Japanese Patent Laying-Open No. 2001-177056 includes a first electrode, a second electrode, and a dielectric film sandwiched between the first and the second electrodes, constituting a capacitive element. The first electrodes and the second electrodes are arranged to face each other in a plane direction and a thickness direction of a semiconductor substrate.

Japanese Patent Laying-Open No. 2002-100732 discloses a method of forming a capacitive element in which at least two interconnections formed in an identical interconnection layer are arranged in proximity to each other to obtain an interconnection capacitance serving as a capacitive element.

Further, Japanese Patent Laying-Open No. 2003-152085 discloses a semiconductor device for preventing noise coupling to an MIM (Metal-Insulator-Metal) capacitance and a method of manufacturing the same. The semiconductor device disclosed in Japanese Patent Laying-Open No. 2003-152085 includes a semiconductor substrate, a capacitive element formed above the semiconductor substrate, and at least a shield layer formed above or below the capacitive element. In another semiconductor device, a stacked film electrically connected to the shield layer is formed in the same layer as the capacitive element to cause the stacked film to operate similarly to the shield layer.

Furthermore, a capacitive element utilizing an interlayer capacitance between interconnection layers is disclosed in "Capacity Limits and Matching Properties of Integrated Capacitors" by Robert Aparicio et al., IEEE Journal of Solid-state Circuits, Vol. 37, No. 3, March 2002, pp. 384-393.

However, the semiconductor integrated circuit device disclosed in Japanese Patent Laying-Open No. 2001-177056 and the method of forming a capacitive element disclosed in Japanese Patent Laying-Open No. 2002-100732 do not include a measure to reduce interference with the capacitive element by an external circuit. Consequently, there arises a problem that the capacitance of the capacitive element fluctuates. Particularly, as an external circuit such as a digital portion progresses to operate faster, the measure against such a problem is increasingly required.

Further, in the semiconductor integrated circuit device or the like disclosed in Japanese Patent Laying-Open Nos. 2001-177056, 2002-100732 and 2003-152085, if interconnection layers and silicon gate layers are arranged with uneven density, the unevenness will cause a difference in the progress of etching. Thus, the configuration obtained at the end of the process may have a non-uniform finish. Furthermore, if an active region and the like formed in a main surface of the semiconductor substrate does not have an area satisfying a predetermined ratio to a fixed region on the main surface, it is not possible to form a layer uniformly over the main surface. Thus, it becomes difficult to control etching appropriately when forming a capacitive element on the film. For these reasons, it is not possible to form a capacitive element offering a desired characteristic.

SUMMARY OF THE INVENTION

To solve the problems described above, an object of the present invention is to provide a semiconductor device having a capacitive element for which external electrical interference is sufficiently reduced and offering a desired characteristic.

The semiconductor device according to the present invention includes a semiconductor substrate including a main surface; a plurality of first interconnections formed in a capacitance forming region defined on the main surface and extending in a predetermined direction; a plurality of second interconnections each adjacent to one of the first interconnections located at an edge of the capacitance forming region, extending in the predetermined direction, and having a fixed potential; and an insulating layer formed on the main surface and filling in between each of the plurality of first interconnections and between the first interconnection and the second interconnection adjacent to each other. The plurality of first interconnections and the plurality of second interconnections are located at substantially equal intervals in a first plane parallel to the main surface, and located to align in a direction substantially perpendicular to the predetermined direction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

First Embodiment

Figure 1:
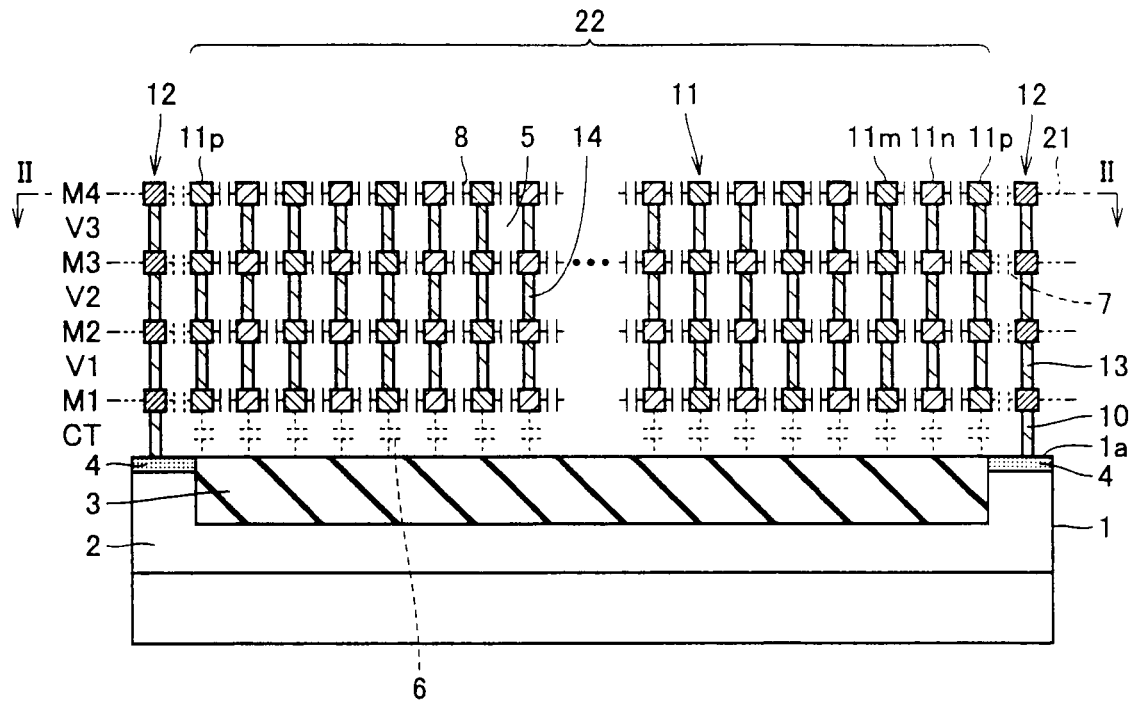
FIG. 1 is a cross-sectional view of a semiconductor device in a first embodiment of the present invention.
Figure 2:
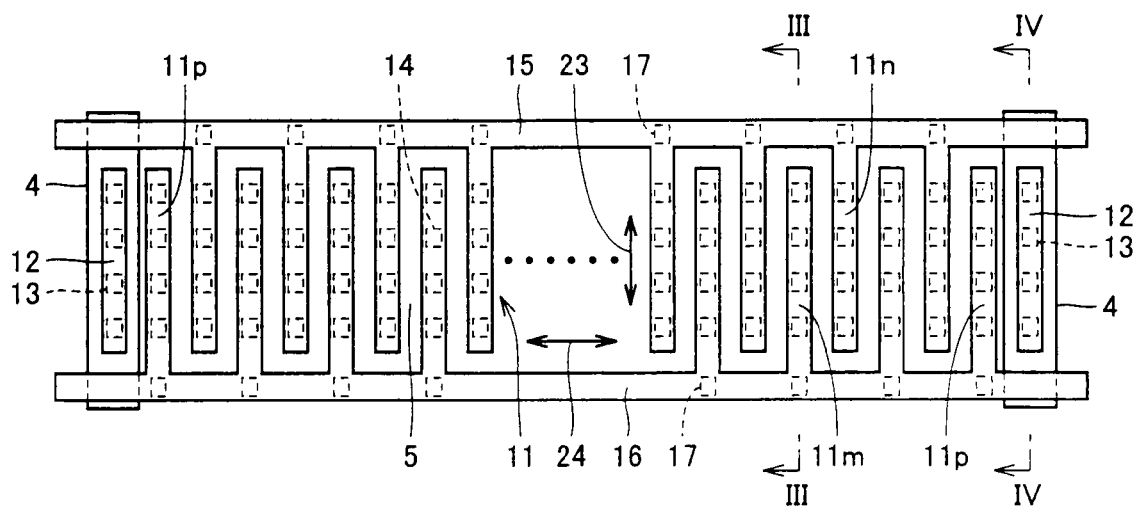
FIG. 2 is a plan view of the semiconductor device taken along the arrowed line II-II in FIG. 1.
Figure 3:
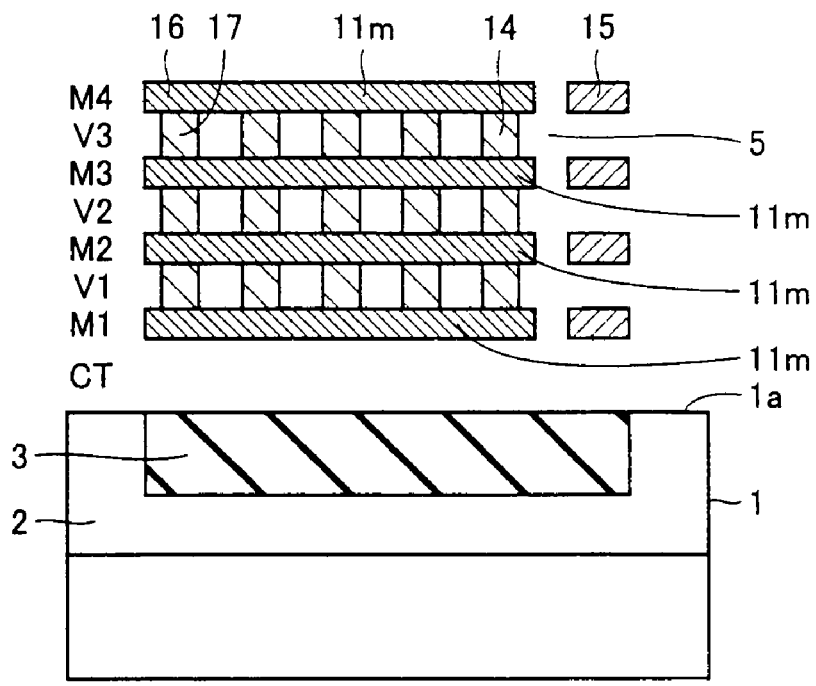
FIG. 3 is a cross-sectional view taken along the line III-III in FIG. 2.

Referring to FIGS. 1 and 2, a semiconductor device according to a first embodiment of the present invention includes a semiconductor substrate 1 having a main surface 1a, a plurality of interconnections 11 formed in a capacitance forming region 22 on main surface 1a, a plurality of interconnections 12 formed outside of capacitance forming region 22, and an insulating layer 5 formed on main surface 1a and filling in between each of interconnections 11 and 12. Interconnections 11 and 12 are formed for example of a metal such as copper (Cu) or aluminum (Al), polysilicon, or the like. Insulating layer 5 is formed for example of TEOS (tetra ethyl ortho silicate), BPTEOS, FSG (F-doped silicate glass), or a silicon oxide film or a silicon nitride film doped with a predetermined concentration of phosphorus (P) or boron (B).

In p-type semiconductor substrate 1, a p well 2 is formed with a predetermined depth from main surface 1a. In main surface 1a of semiconductor substrate 1, an isolating oxide film 3 is formed in p well 2. Further, in main surface 1a, an active region 4 connected to a ground potential is formed with a predetermined depth on either side of isolating oxide film 3. Isolating oxide film 3 extends below capacitance forming region 22 in which the plurality of interconnections 11 are formed, and active region 4 extends below the plurality of interconnections 12.

Interconnections 11 and 12 are formed in a plane 21 extending parallel to main surface 1a at a position apart from main surface 1a. A plurality of planes 21 are defined at equal intervals (hereinafter, layers in which the plurality of planes 21 are defined will be referred to as an M (metal) 1 layer, an M2 layer, an M3 layer, . . . , respectively, in order of closeness to main surface 1a, a space between main surface 1a and M1 layer will be referred to as a CT (contact) layer, and spaces between vertically adjacent M layers will be referred to as a V (via hole) 1 layer, a V2 layer, a V3 layer, . . . , respectively). Interconnections 11 and 12 are formed in each of M1 layer to M4 layer such that, when main surface 1a is viewed from the front of FIG. 2, they are seen overlying each other on main surface 1a.

Each of the plurality of interconnections 11 extends in plane 21 in a predetermined direction (a direction shown by an arrow 23 in FIG. 2). The plurality of interconnections 11 align each other at equal intervals in a direction orthogonal to the direction in which interconnections 11 extend (a direction shown by an arrow 24 in FIG. 2).

In plane 21, interconnections 15 and 16 are formed apart from each other to extend in the direction shown by arrow 24, between active regions 4 formed on both sides of isolating oxide film 3. The plurality of interconnections 11 include a plurality of interconnections 11n branched from interconnection 15 and extending toward interconnection 16, and a plurality of interconnections 11m branched from interconnection 16 and extending toward interconnection 15. Interconnections 11m and 11n are arranged in such a manner that the teeth of two combs face each other in an interdigitated pattern.

Each of the plurality of interconnections 12 extends in plane 21 in the same direction as the direction in which the plurality of interconnections 11 extend. The plurality of interconnections 12 are formed adjacent to interconnections 11p of the plurality of interconnections 11 located at the edges of capacitance forming region 22. That is, the plurality of interconnections 12 are positioned at both ends of the plurality of interconnections 11 in the direction in which interconnections 11 align. The distance between interconnection 11p and interconnection 12 is the same as the distance between neighboring interconnections 11.

Referring to FIGS. 1 to 4, interconnections 11 and 12 in vertically adjacent layers are connected by via holes 14 and 13, respectively, formed in V1 layer to V3 layer. Note that, in FIG. 2, via holes 14 and 13 formed in V3 layer are shown by dashed lines. Further, interconnection 12 formed in M1 layer and active region 4 formed in main surface 1a are connected by a contact 10 formed in CT layer. Interconnections 15 and 16 in vertically adjacent layers are connected by via holes 17 formed in V1 layer to V3 layer.

With the configuration described above, the plurality of interconnections 11m are at the same potential, having a potential drawn from a predetermined position of interconnection 16 in M4 layer, and the plurality of interconnections 11n are at the same potential, having a potential drawn from a predetermined position of interconnection 15 in M4 layer. Thus, by providing a potential difference between interconnections 11m and 11n, an interconnection capacitance 8 using insulating layer 5 as a dielectric layer is formed between interconnections 11m and 11n adjacent to each other in each plane 21 defined in M1 layer to M4 layer. Although a large number of interconnections 11 are formed, interconnections 11m and 11n can be set at respective predetermined potentials all at once by arranging them in the form of two combs.

In this case, by forming the plurality of interconnections 11 in the plurality of planes 21, interconnection capacitance 8 having a greater capacitance value can be formed in a limited region on main surface 1a. Further, since the plurality of interconnections 11 are arranged to align in the direction orthogonal to their extending direction, the distance between which interconnections 11 are adjacent to each other in that direction can be set longer, achieving a greater capacitance value.

Furthermore, since the plurality of interconnections 12 are connected via active regions 4 to p well 2 at a ground potential, they are fixed at the ground potential. Thus, the plurality of interconnections 12 act as a shield for capacitance forming region 22, playing a role to block electrical interference (noise) from an external circuit provided around capacitance forming region 22. In this case, since the plurality of interconnections 12 are arranged at the both ends of the plurality of interconnections 11, noise from the external circuit provided on either side of capacitance forming region 22 can surely be blocked.

Note that, in FIG. 1, parasitic capacitances 6 formed between main surface 1a of semiconductor substrate 1 and the plurality of interconnections 11 provided in M1 layer, and parasitic capacitances 7 formed between the plurality of interconnections 11p and the plurality of interconnections 12 are shown by dotted lines.

As described above, the semiconductor device in the first embodiment of the present invention includes semiconductor substrate 1 having main surface 1a; a plurality of interconnections 11 as first interconnections formed in capacitance forming region 22 defined on main surface 1a and extending in a predetermined direction; insulating layer 5 formed on main surface 1a and filling in between each of the plurality of interconnections 11; and a plurality of interconnections 12 as second interconnections adjacent to interconnections 11p as the first interconnections arranged at the edges of capacitance forming region 22, extending in a predetermined direction, and having a fixed potential. Interconnections 11 and 12 are arranged at substantially equal intervals in plane 21 as a first plane parallel to main surface 1a.

Interconnections 11 and 12 are arranged to align in a direction substantially perpendicular to the predetermined direction. The plurality of interconnections 12 are provided at both ends of the plurality of interconnections 11 arranged in plane 21. Interconnections 11 and 12 are formed in a plurality of planes 21 spaced with each other.

Although the description has been given in the present embodiment on the case where the plurality of interconnections 12 are fixed at a ground potential, the plurality of interconnections 12 may be fixed for example at a power supply potential, depending on the type of the well at the bottom. Further, although the description has been given on the case where the plurality of planes 21 are defined at equal intervals with each other, for example the distance between M1 layer and M2 layer may be different from the distance between M2 layer and M3 layer. Furthermore, although the description has been given on the case where interconnections 11 and 12 are formed in four layers from M1 layer to M4 layer, it is satisfactory if interconnections 11 and 12 are formed in one or more layers.

Further, when main surface 1a of p-type semiconductor substrate 1 is provided with a p well for example, the p well may be fixed at a ground potential, and when main surface 1a is provided with an n well, the n well may be fixed at a power supply potential and semiconductor substrate 1 may be fixed at a ground potential. Furthermore, when main surface 1a of n-type semiconductor substrate 1 is provided with an n well, the n well may be fixed at a power supply potential, and when main surface 1a is provided with a p well, the p well may be fixed at a ground potential and semiconductor substrate 1 may be fixed at a power supply potential.

According to the semiconductor device with the configuration described above, the plurality of interconnections 11 constituting interconnection capacitance 8 and the plurality of interconnections 12 acting as a shield are formed at equal intervals. Thus, uneven arrangement of the interconnections will not be caused between the central portion and the end portion of capacitance forming region 22 in plane 21. Therefore, when forming interconnections 11 and 12, etching progresses at a uniform rate anywhere in capacitance forming region 22, ensuring a uniform finished configuration. Further, since the plurality of interconnections 12 are at a fixed potential, the influence of noise from an external circuit exerted on interconnection capacitance 8 can be reduced. That is, in the present embodiment, the plurality of interconnections 12 serve as a dummy element allowing for a uniform process and also as a shield for blocking external noise. For the reasons described above, interconnection capacitance 8 having no fluctuations in a capacitance value and offering a desired characteristic can be formed.

Second Embodiment

A semiconductor device in a second embodiment of the present invention basically has a configuration similar to that of the semiconductor device in the first embodiment. Hereinafter, description of identical parts will not be repeated.

Figure 4:
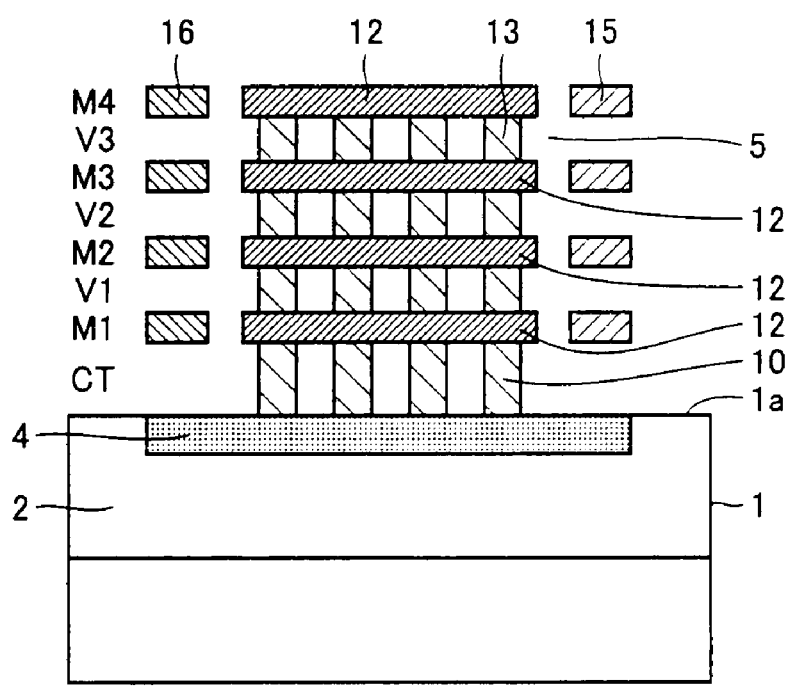
FIG. 4 is a cross-sectional view taken along the line IV-IV in FIG. 2.
Figure 5:
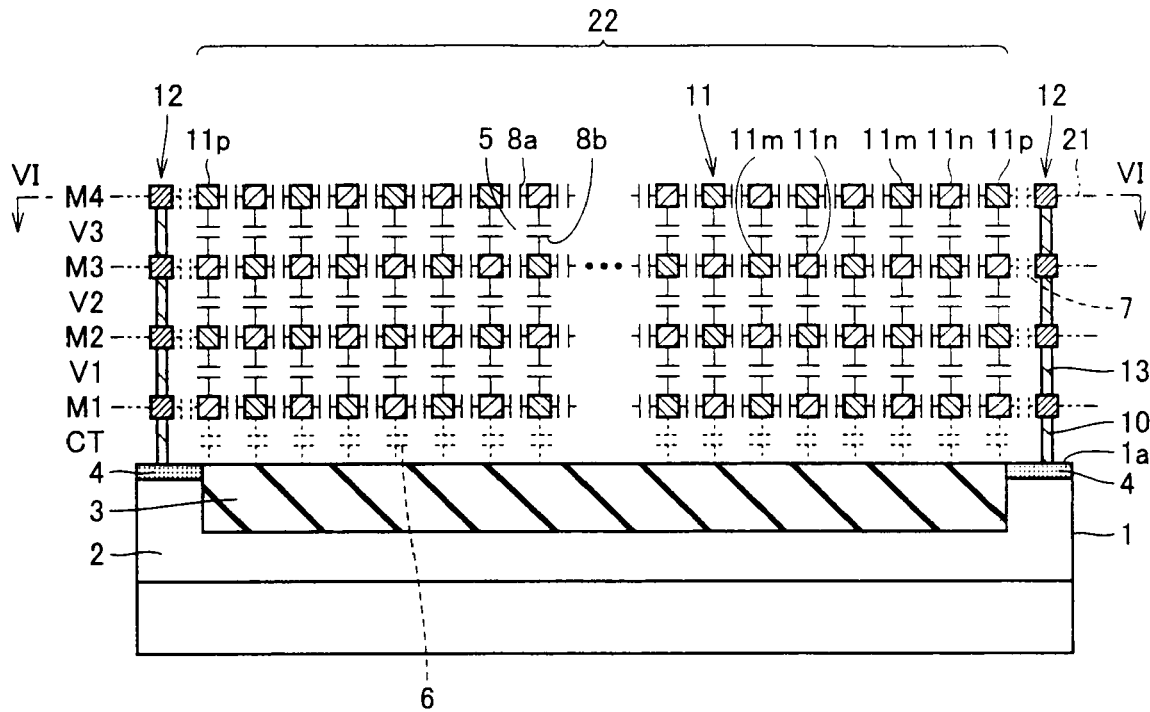
FIG. 5 is a cross-sectional view showing a semiconductor device in a second embodiment of the present invention.
Figure 6:
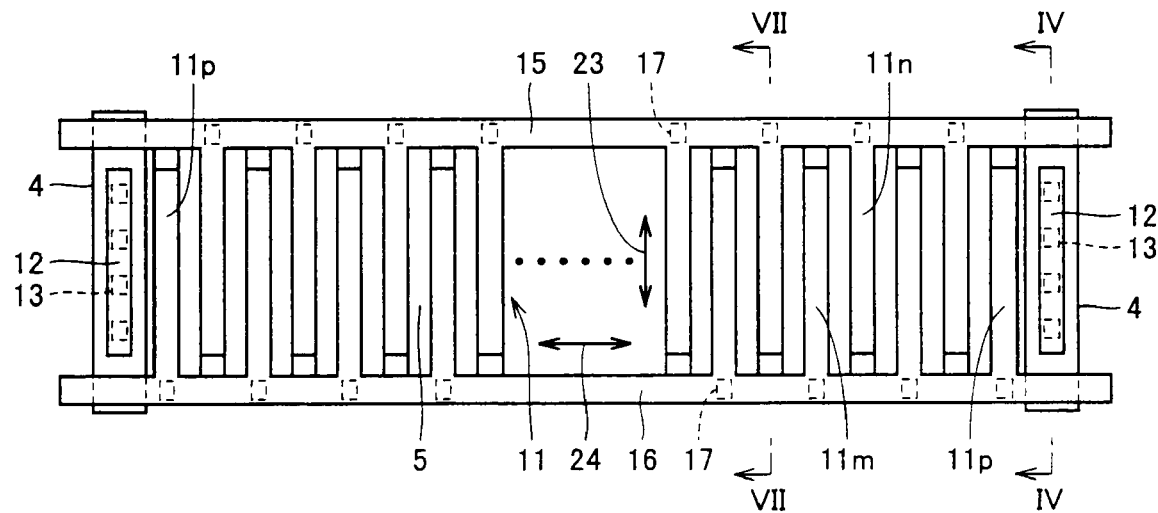
FIG. 6 is a plan view of the semiconductor device taken along the arrowed line VI-VI in FIG. 5.
Figure 7:
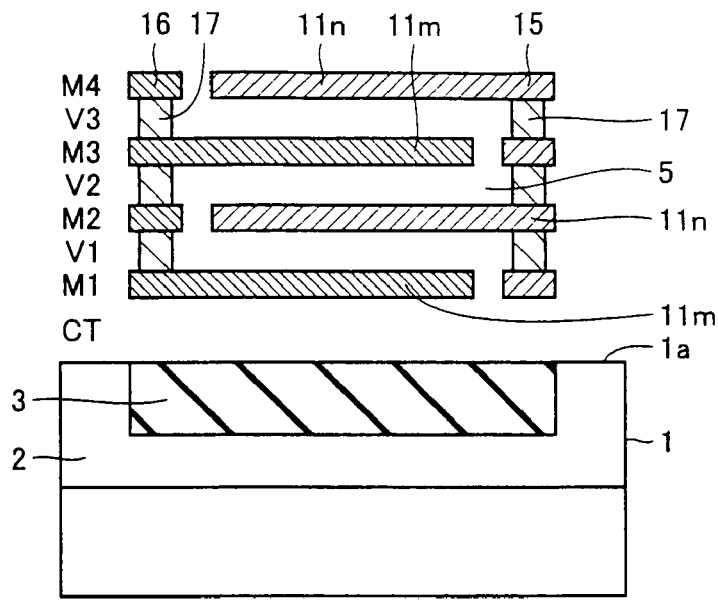
FIG. 7 is a cross-sectional view taken along the line VII-VII in FIG. 6.

Of FIGS. 5 to 7 showing the semiconductor device of the present embodiment, the cross section along the line IV-IV in FIG. 6 has a configuration identical to that of the cross section shown in FIG. 4. In FIG. 6, via holes 13 formed in V3 layer are shown by dashed lines.

Referring to FIGS. 5 to 7, in the present embodiment, the plurality of interconnections 11 in vertically adjacent layers are not connected by a via hole, and insulating layer 5 is filled therebetween. The plurality of interconnections 11 are formed such that, when main surface 1a is viewed from the front of FIG. 6, interconnections 11 formed in M1 layer and M3 layer are seen overlying each other on main surface 1a, and interconnections 11 formed in M2 layer and M4 layer are seen overlying each other on main surface 1a.

For example, when a cross section along the line VII-VII in FIG. 6 is viewed in FIG. 7, M1 layer and M3 layer are provided with interconnections 11m branched from interconnection 16 formed in each layer and extending toward interconnection 15. M2 layer and M4 layer are provided with interconnections 11n branched from interconnection 15 formed in each layer and extending toward interconnection 16. That is, in the present embodiment, interconnections 11m and 11n are arranged in such a manner that the teeth of two combs face each other in an interdigitated pattern in plane 21 as well as in a plane orthogonal to plane 21.

With this configuration, in the present embodiment, an interconnection capacitance 8a is formed between interconnections 11m and 11n adjacent to each other in plane 21, and an interconnection capacitance 8b is also formed between interconnections 11m and 11n in vertically adjacent layers.

According to the semiconductor device with such a configuration, the effect similar to that described in the first embodiment can be obtained. In addition, since a capacitance is also formed between the interconnections in vertically adjacent layers, a greater capacitance value can be achieved in a limited region on main surface 1a.

Third Embodiment

A semiconductor device in a third embodiment of the present invention basically has a configuration similar to that of the semiconductor device in the first embodiment. Hereinafter, description of identical parts will not be repeated.

Figure 8:
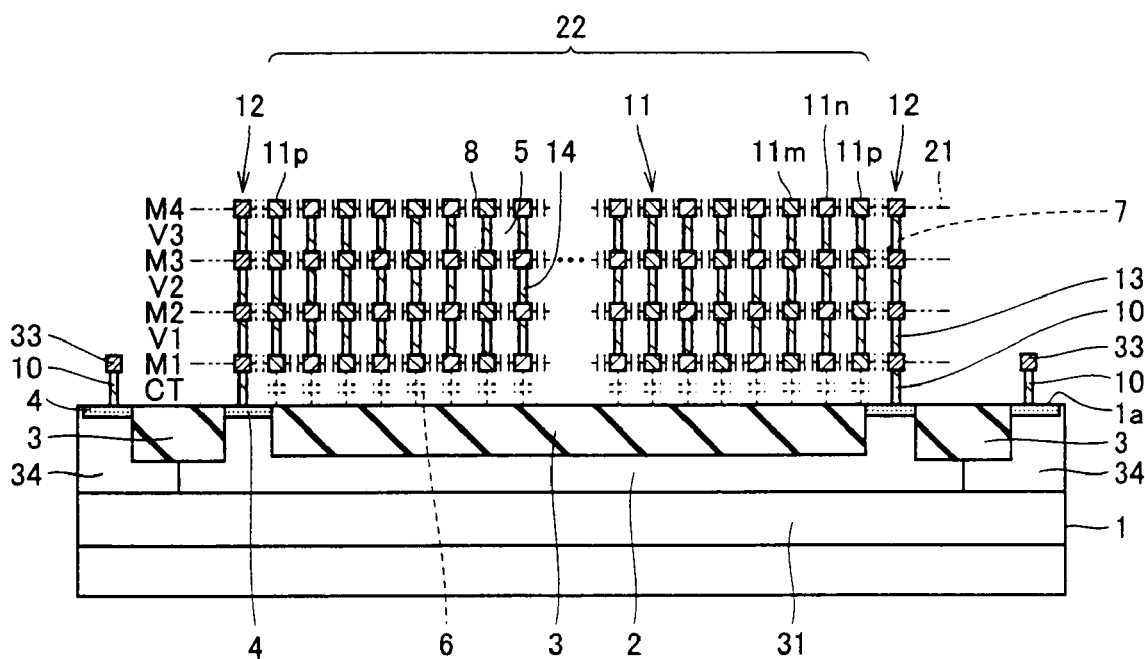
FIG. 8 is a cross-sectional view showing a semiconductor device in a third embodiment of the present invention.

Referring to FIG. 8, semiconductor substrate 1 of the present embodiment includes an n well 34 formed on either side of p well 2. P well 2 is formed to be located immediately below interconnections 11 and 12 in a lateral direction and a depth direction of the plane of FIG. 8. In semiconductor substrate 1, an $n^+$ well 31 is formed at a predetermined depth from main surface 1a. $N^+$ well 31 is formed all over the position underlying n wells 34 and p well 2 in the lateral direction and the depth direction of the plane of FIG. 8. $N^+$ well 31 extends parallel to n wells 34 and p well 2.

When p well 2 is not used to fix the plurality of interconnections 12 at a potential, p well 2 is only necessary to underlie at least a region over which, when viewed from above, capacitance forming region 22 is seen on main surface 1a in the lateral direction and the depth direction of the plane of FIG. 8. Similarly, n⁻ well 31 is only necessary to underlie at least all the region over which, when viewed from above, capacitance forming region 22 is seen on main surface 1a.

In main surface 1a, isolating oxide film 3 is formed at a boundary between n well 34 and p well 2, and active region 4 is further formed on n well 34. Active region 4 is connected via contact 10 to an interconnection 33 formed on main surface 1a and fixed at a power supply potential. With this configuration, n⁺ well 31 is fixed at the power supply potential.

According to the semiconductor device with such a configuration, the effect similar to that described in the first embodiment can be obtained. In addition, by providing semiconductor substrate 1 with n⁺ well 31 having a fixed potential, noise transmitted mainly from a rear side of semiconductor substrate 1 to capacitance forming region 22 can be blocked effectively. The effect similar to that obtained by n⁺ well 31 can also be achieved by p well 2 having a fixed potential.

It is to be noted that application is not limited to the potential fixing described in the present embodiment. When an n well is formed in main surface 1a of semiconductor substrate 1 and a p⁺ well is formed under the n well, the plurality of interconnections 12 may be fixed at a power supply potential via the n well and the p⁺ well may be fixed at a ground potential. Thus, the effect similar to that described above can be obtained.

Fourth Embodiment

A semiconductor device in a fourth embodiment of the present invention shown in FIGS. 9 to 12 basically has a configuration similar to those of the semiconductor devices in the first and the third embodiments. Hereinafter, description of identical parts will not be repeated.

Figure 10:
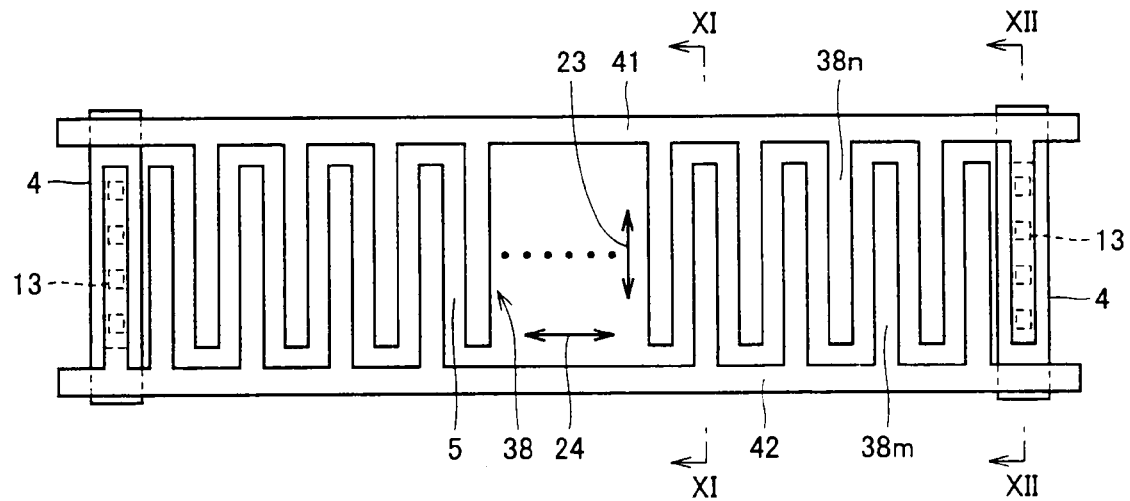
FIG. 10 is a plan view of the semiconductor device taken along the arrowed line X-X in FIG. 9.
Figure 11:
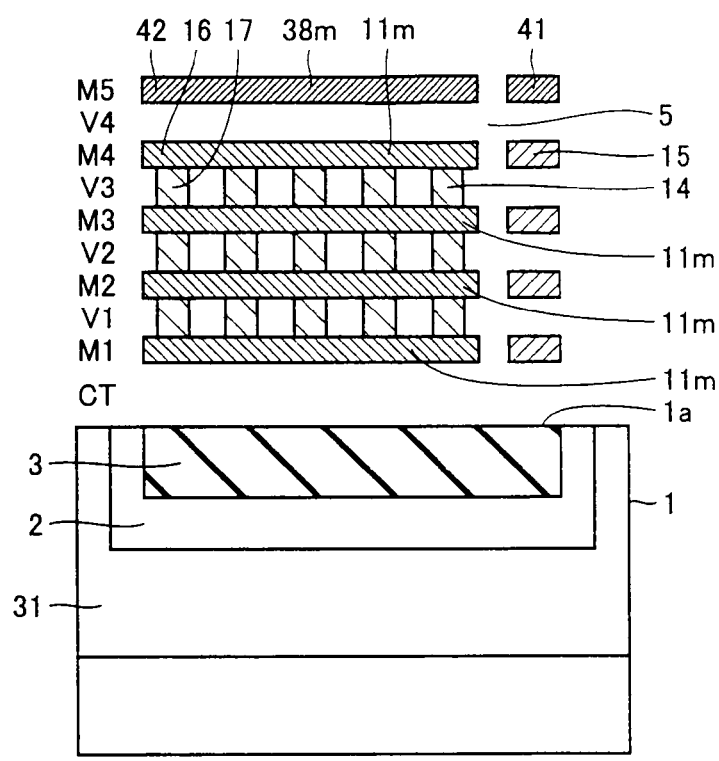
FIG. 11 is a cross-sectional view taken along the line XI-XI in FIG. 10.
Figure 12:
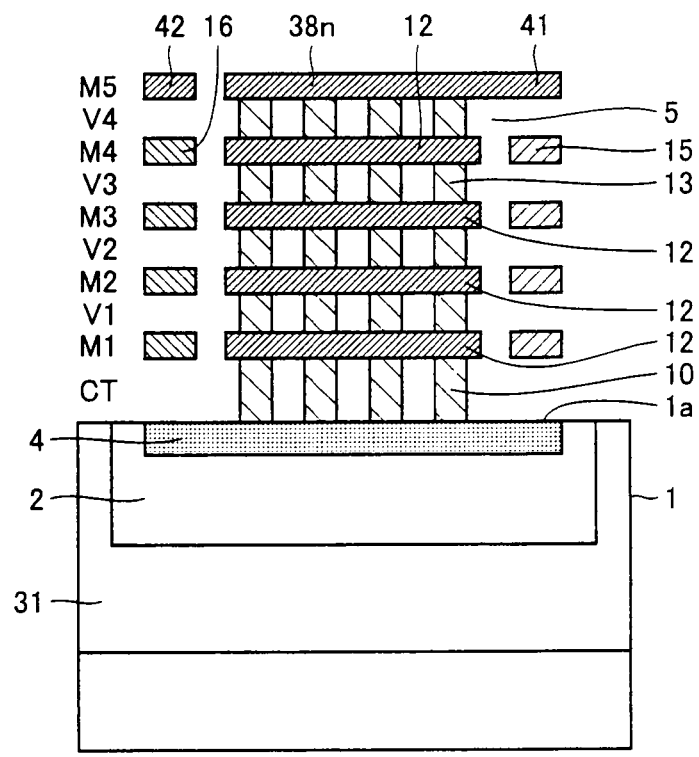
FIG. 12 is a cross-sectional view taken along the line XII-XII in FIG. 10.

In FIG. 10, via hole 13 formed in V4 layer is shown by a dashed line.

Referring to FIGS. 9 to 12, in the present embodiment, a plane 37 extending parallel to main surface 1a is defined at a position of an M5 layer spaced from M4 layer by a predetermined interval therebetween. Plane 37 is defined such that capacitance forming region 22 is located between plane 37 and main surface 1a. Plane 37 is provided with a plurality of interconnections 38. The plurality of interconnections 38 extend in plane 37 in a direction identical to the direction in which the plurality of interconnections 11 extend (a direction shown by arrow 23 in FIG. 10). The plurality of interconnections 38 align each other at equal intervals in a direction orthogonal to the direction in which interconnections 38 extend (a direction shown by arrow 24 in FIG. 10).

In plane 37, interconnections 41 and 42 are formed apart from each other to extend in the direction shown by arrow 24. The plurality of interconnections 38 include a plurality of interconnections 38n branched from interconnection 41 and extending toward interconnection 42, and a plurality of interconnections 38m branched from interconnection 42 and extending toward interconnection 41, and interconnections 38m and 38n are arranged in such a manner that the teeth of two combs face each other in an interdigitated pattern. Interconnections 38m and 38n are formed such that, when main surface 1a is viewed from the front of FIG. 10, they are seen in overlying relation with interconnections 11m, 11n and interconnections 12 on main surface 1a.

Interconnection 12 formed in M4 layer and interconnection 38 formed in M5 layer above interconnection 12 are connected by via hole 13. With this configuration, interconnections 12 and 38 are fixed at a ground potential.

Figure 9:
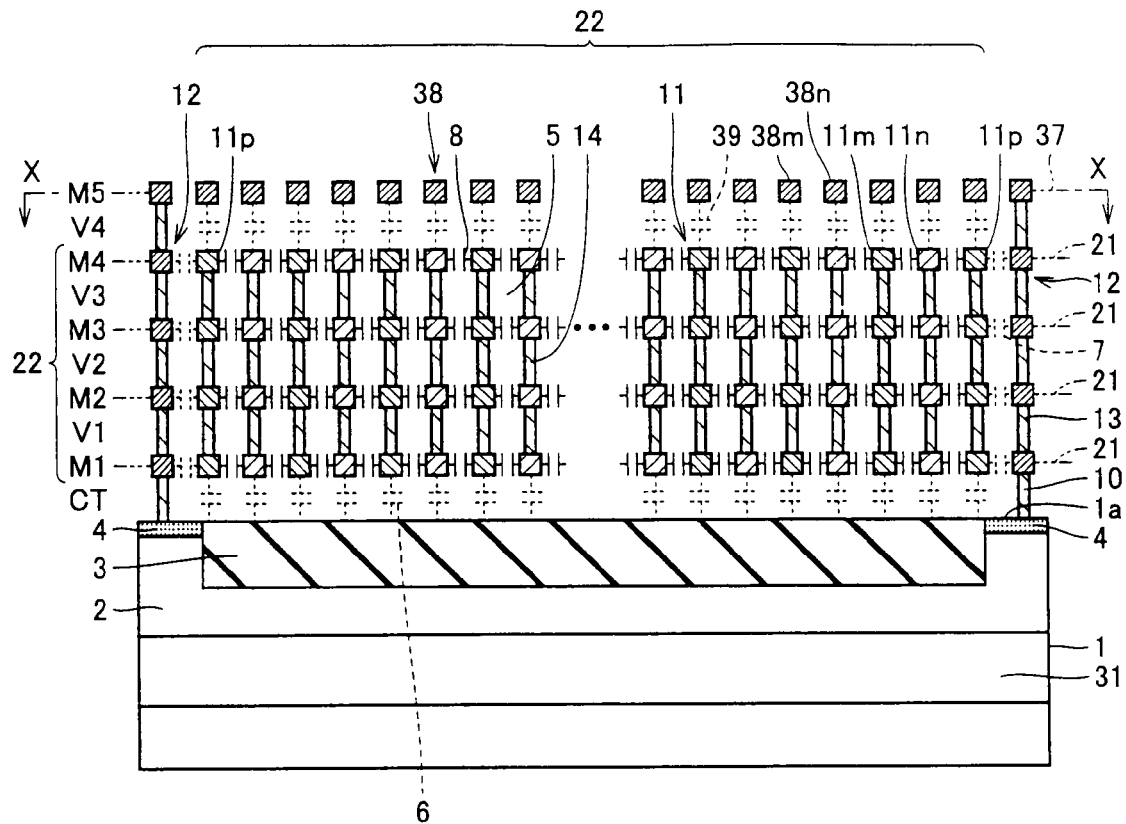
FIG. 9 is a cross-sectional view showing a semiconductor device in a fourth embodiment of the present invention.

It is to be noted that, in FIG. 9, a parasitic capacitance 39 formed between interconnection 38 in M5 layer and interconnection 11 in M4 layer is shown by a dotted line.

According to the semiconductor device with such a configuration, the effect similar to those described in the first and the third embodiments can be obtained. In addition, since the plurality of interconnections 38 covering capacitance forming region 22 from above act as a shield together with the plurality of interconnections 12, noise from an external circuit can be blocked further reliably.

Fifth Embodiment

A semiconductor device in a fifth embodiment of the present invention basically has a configuration similar to that of the semiconductor device in the fourth embodiment. Hereinafter, description of identical parts will not be repeated.

Figure 13:
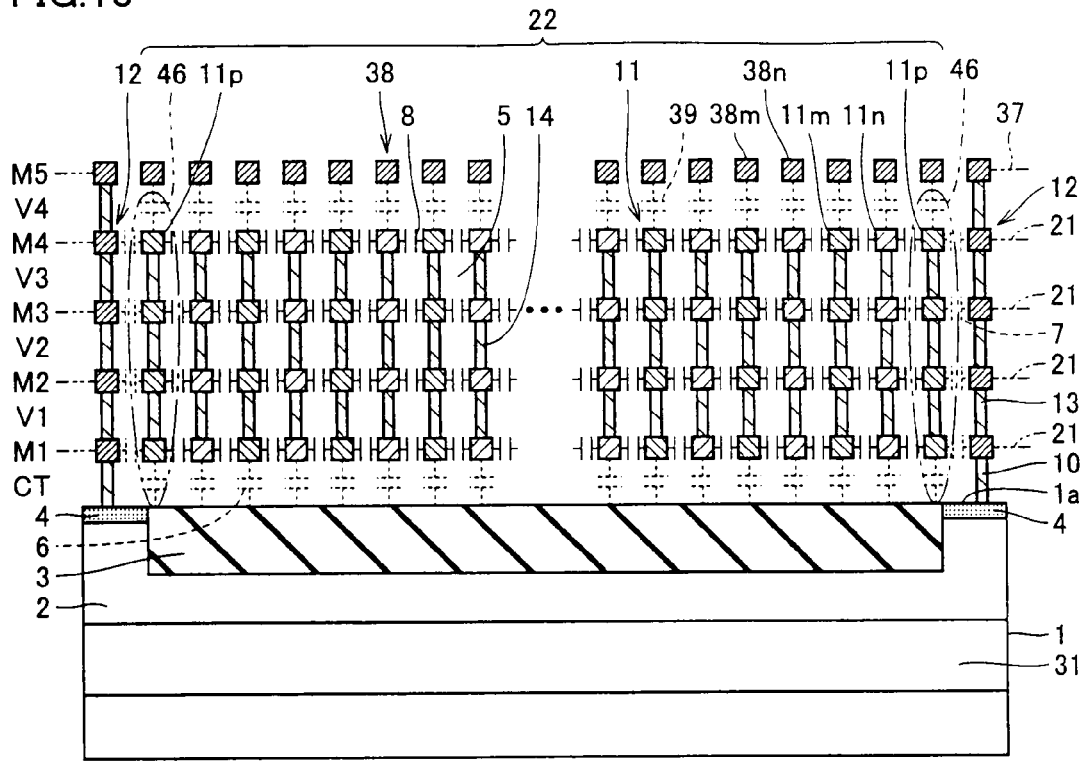
FIGS. 13 to 22 are cross-sectional views showing semiconductor devices in fifth to fourteenth embodiments of the present invention, respectively.

Referring to FIG. 13, in the present embodiment, interconnections 11p located at a position adjacent to the plurality of interconnections 12 having a fixed potential (i.e., at a position surrounded by a chain double-dashed line 46) are connected to a low impedance node. More specifically, the plurality of interconnections 11m including interconnections 11p in FIG. 13 are connected to a relatively low impedance node, and the plurality of interconnections 11n not including interconnections 11p are connected to a relatively high impedance node.

According to the semiconductor device with such a configuration, the effect similar to that described in the fourth embodiment can be obtained. In addition, since the plurality of interconnections 11p are connected to a relatively low impedance node, the influence of parasitic capacitance 7 formed between interconnection 11p and interconnection 12 can be reduced. Thus, a circuit using interconnection capacitance 8 can be implemented with higher accuracy, preventing parasitic capacitance 7 from causing deviation of a capacitance value ratio in interconnection capacitance 8 or deviation from a desired transmissibility when interconnection capacitance 8 is utilized in an integrator using an amplifier.

Sixth Embodiment

A semiconductor device in a sixth embodiment of the present invention basically has a configuration similar to that of the semiconductor device in the fourth embodiment. Hereinafter, description of identical parts will not be repeated.

Figure 14:
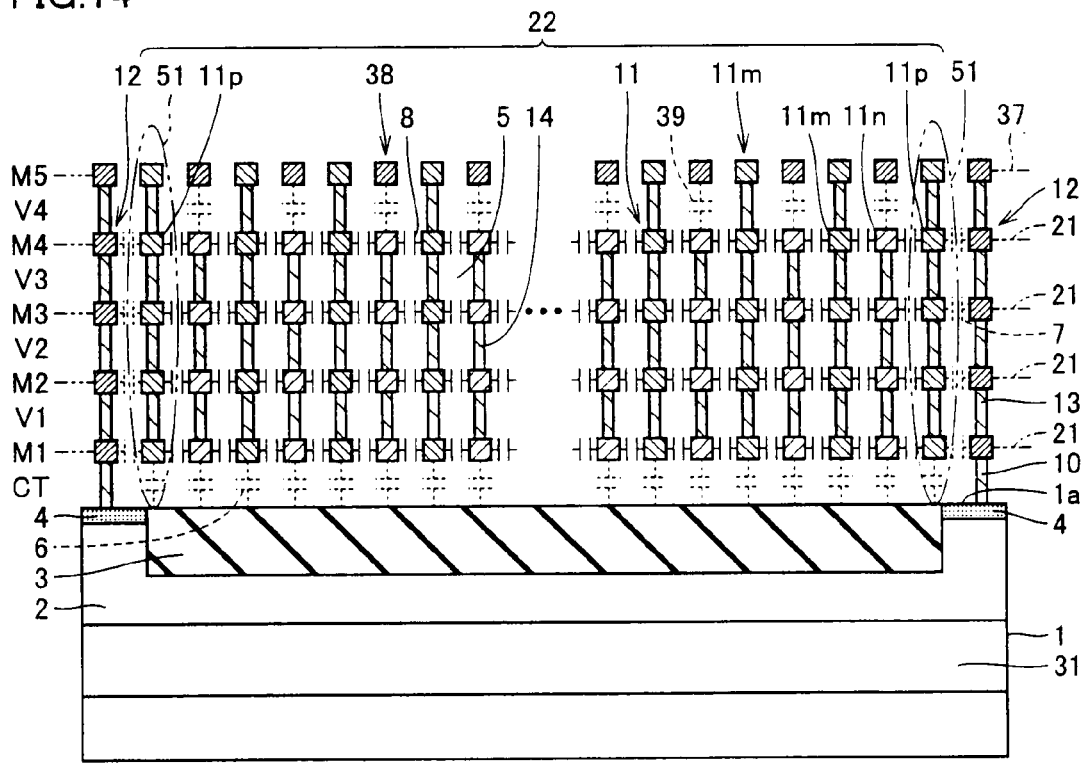

Referring to FIG. 14, in the present embodiment, interconnections 38 formed in M5 layer and connected by via holes 13 to interconnections 12 having a fixed potential and interconnections 11m formed in M5 layer and connected by via holes 14 to interconnections 11m formed in M4 layer are provided in an interdigitated pattern. Further, the plurality of interconnections 11m include interconnections 11p formed at a position adjacent to the plurality of interconnections 12 having a fixed potential (i.e., at a position surrounded by a chain double-dashed line 51). The plurality of interconnections 11m are connected to a relatively low impedance node, and the plurality of interconnections 11n are connected to a relatively high impedance node.

According to the semiconductor device with such a configuration, the effect similar to that described in the fourth embodiment can be obtained. In addition, interconnections 38 having a fixed potential can be used as a shield for capacitance forming region 22, and the influence due to parasitic capacitance 7 can also be reduced as in the effect described in the fifth embodiment.

Seventh Embodiment

A semiconductor device in a seventh embodiment of the present invention basically has a configuration similar to that of the semiconductor device in the fourth embodiment. Hereinafter, description of identical parts will not be repeated.

Figure 15:
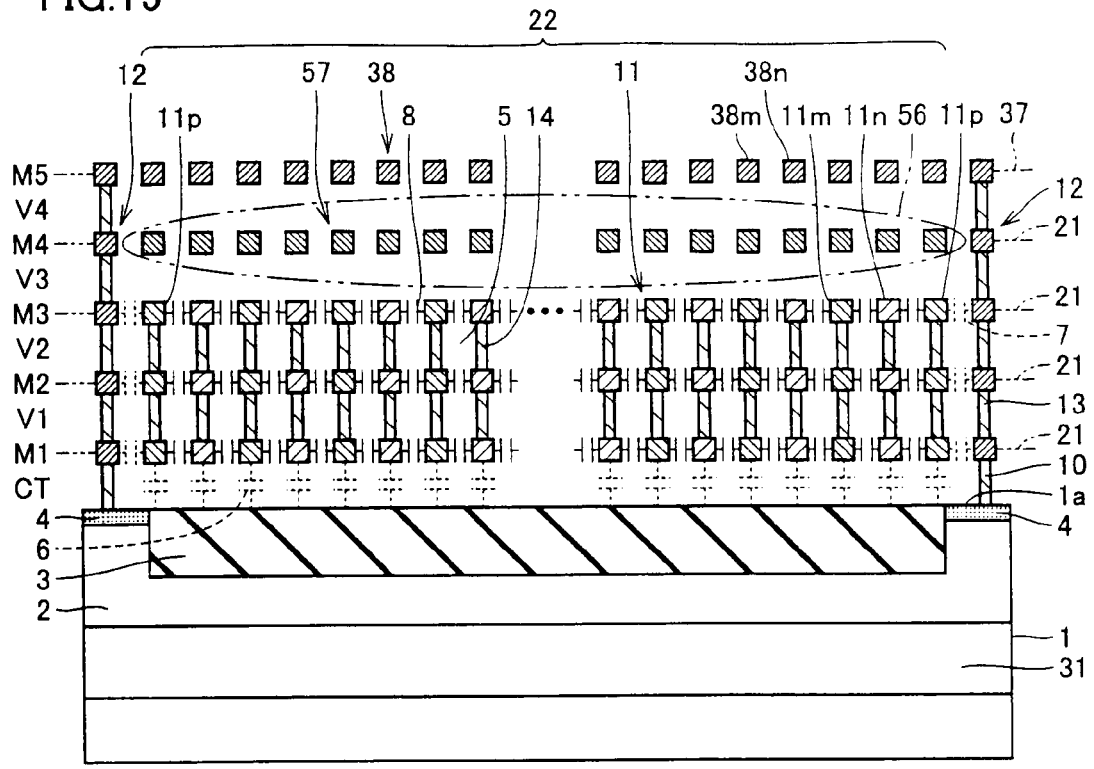

Referring to FIG. 15, in the present embodiment, a plurality of floating interconnections 57 spaced from each other are formed at a position in M4 layer sandwiched between interconnections 12 at both ends (i.e., at a position surrounded by a chain double-dashed line 56). The plurality of floating interconnections 57 extend in a depth direction of the plane of FIG. 15. Floating interconnection 57 is completely surrounded by insulating layer 5, and has a floating potential. More specifically, floating interconnection 57 at a floating potential is positioned between interconnection 38 formed in M5 layer and having a fixed potential and interconnection 11 formed in M3 layer.

According to the semiconductor device with such a configuration, the effect similar to that described in the fourth embodiment can be obtained. In addition, by providing floating interconnection 57 having a floating potential at the position described above, parasitic capacitance 39 formed between interconnection 11 and interconnection 38 (see FIG. 9) can be reduced. Thus, a circuit using interconnection capacitance 8 can be implemented with higher accuracy.

Eighth Embodiment

A semiconductor device in an eighth embodiment of the present invention basically has a configuration similar to that of the semiconductor device in the fourth embodiment. Hereinafter, description of identical parts will not be repeated.

Figure 16:
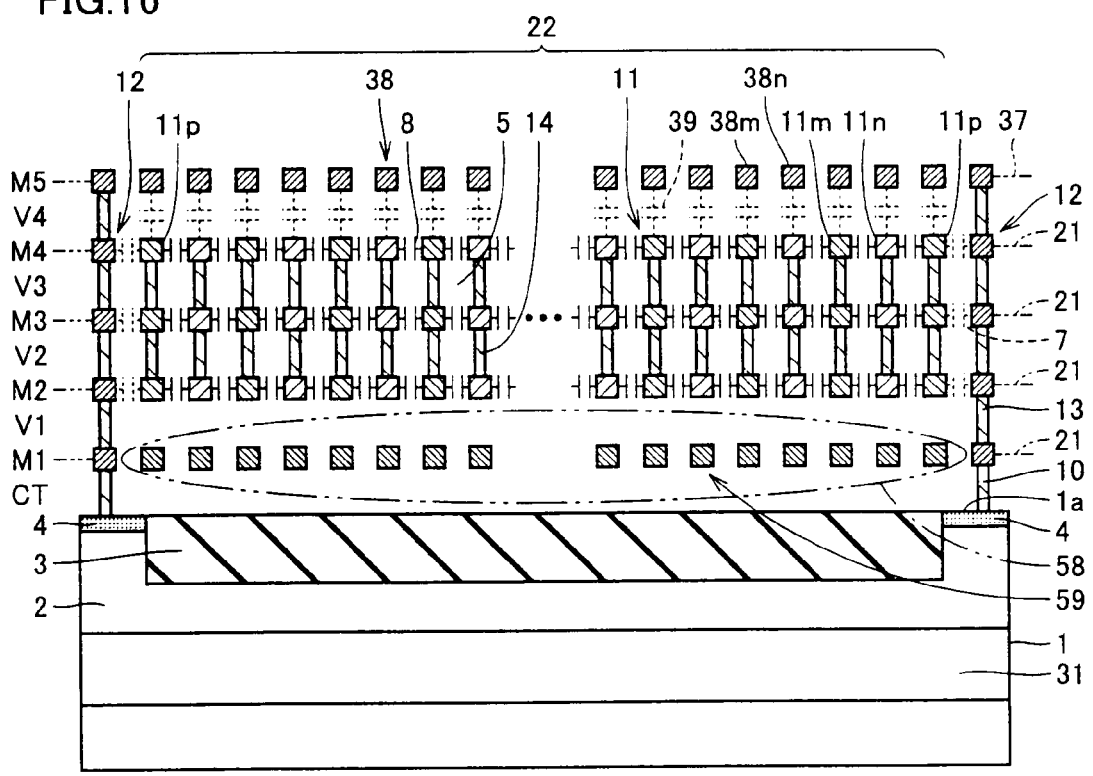

Referring to FIG. 16, in the present embodiment, a plurality of floating interconnections 59 spaced from each other are formed at a position in M1 layer sandwiched between interconnections 12 at both ends (i.e., at a position surrounded by a chain double-dashed line 58). The plurality of floating interconnections 59 extend in a depth direction of the plane of FIG. 16. Floating interconnection 59 is completely surrounded by insulating layer 5, and has a floating potential. More specifically, floating interconnection 59 at a floating potential is positioned between interconnection 11 formed in M2 layer and main surface 1a of semiconductor substrate 1.

According to the semiconductor device with such a configuration, the effect similar to that described in the fourth embodiment can be obtained. In addition, by providing floating interconnection 59 having a floating potential at the position described above, parasitic capacitance 6 formed between interconnection 11 and main surface 1a (see FIG. 9) can be reduced. Thus, a circuit using interconnection capacitance 8 can be implemented with higher accuracy.

Ninth Embodiment

A semiconductor device in a ninth embodiment of the present invention basically has a configuration similar to that of the semiconductor device in the fourth embodiment. Hereinafter, description of identical parts will not be repeated.

Figure 17:
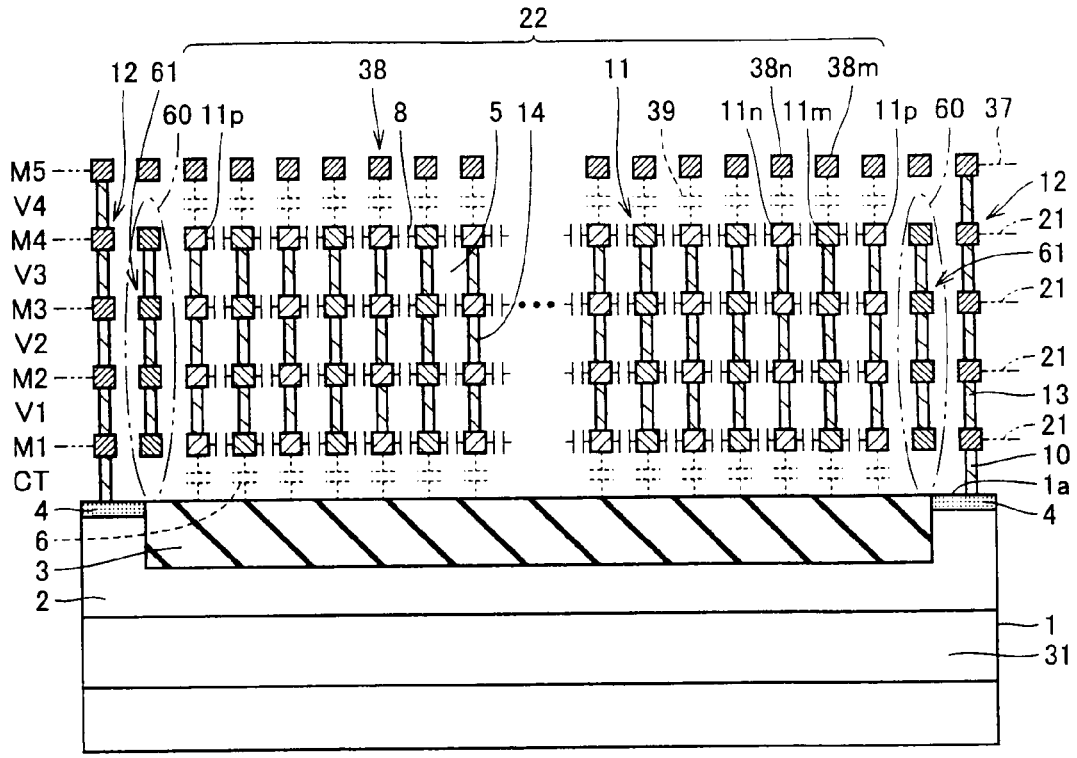

Referring to FIG. 17, in the present embodiment, a plurality of floating interconnections 61 are formed at a position adjacent to the plurality of interconnections 12 in M1 layer to M4 layer (i.e., at a position surrounded by a chain double-dashed line 60). The plurality of floating interconnections 61 extend in a depth direction of the plane of FIG. 17. Floating interconnection 61 is completely surrounded by insulating layer 5, and has a floating potential. More specifically, floating interconnection 61 at a floating potential is positioned between interconnection 11p formed in each of M1 to M4 layers and interconnection 12 having a fixed potential.

According to the semiconductor device with such a configuration, the effect similar to that described in the fourth embodiment can be obtained. In addition, by providing floating interconnection 61 having a floating potential at the position described above, parasitic capacitance 7 formed between interconnection 11 and interconnection 12 (see FIG. 9) can be reduced. Thus, a circuit using interconnection capacitance 8 can be implemented with higher accuracy.

Tenth Embodiment

A semiconductor device in a tenth embodiment of the present invention basically has a configuration similar to that of the semiconductor device in the fourth embodiment. Hereinafter, description of identical parts will not be repeated.

Figure 18:
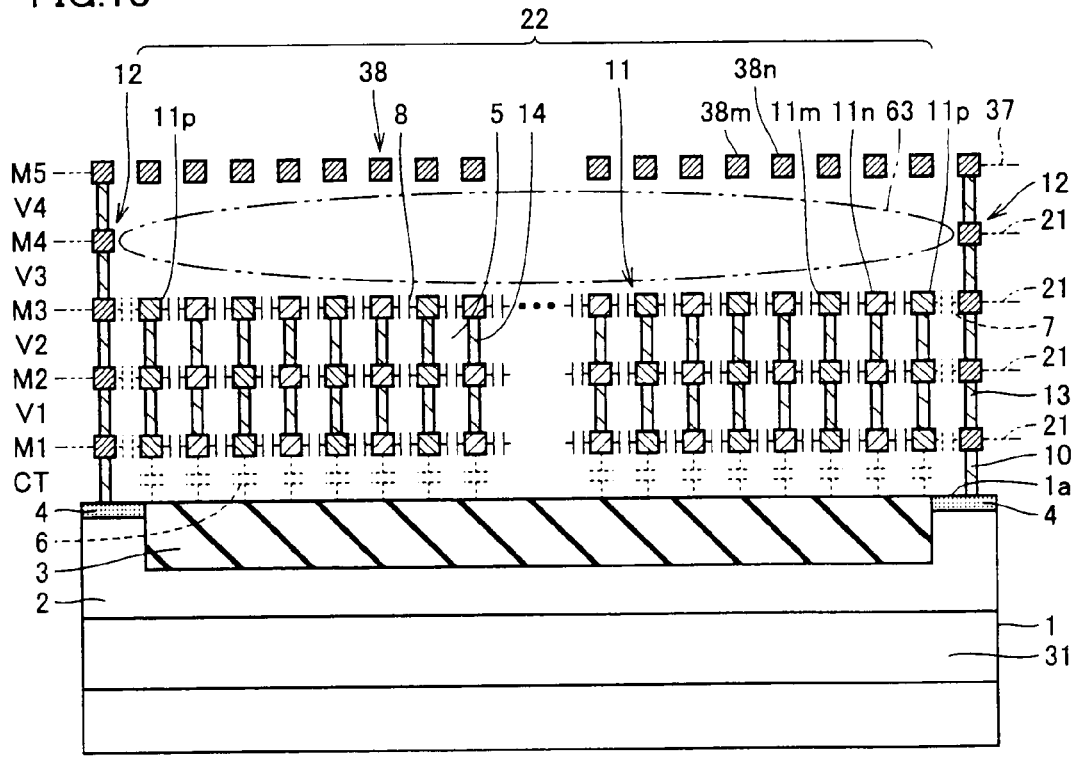

Referring to FIG. 18, in the present embodiment, no interconnections are provided in a position in M4 layer sandwiched between interconnections 12 at both ends (i.e., at a position surrounded by a chain double-dashed line 63), and the position is filled with insulating layer 5. Thus, the distance from interconnection 38 formed in M5 layer to interconnection 11 adjacent to interconnection 38 (i.e., interconnection 11 formed in M3 layer) is greater than the distance between vertically adjacent interconnections 11.

According to the semiconductor device with such a configuration, the effect similar to that described in the fourth embodiment can be obtained. In addition, by providing no interconnections in M4 layer and increasing the distance between interconnection 11 and interconnection 38, parasitic capacitance 39 formed between interconnection 11 and interconnection 38 (see FIG. 9) can be reduced. Thus, a circuit using interconnection capacitance 8 can be implemented with higher accuracy.

Eleventh Embodiment

A semiconductor device in an eleventh embodiment of the present invention basically has a configuration similar to that of the semiconductor device in the seventh embodiment. Hereinafter, description of identical parts will not be repeated.

Figure 19:
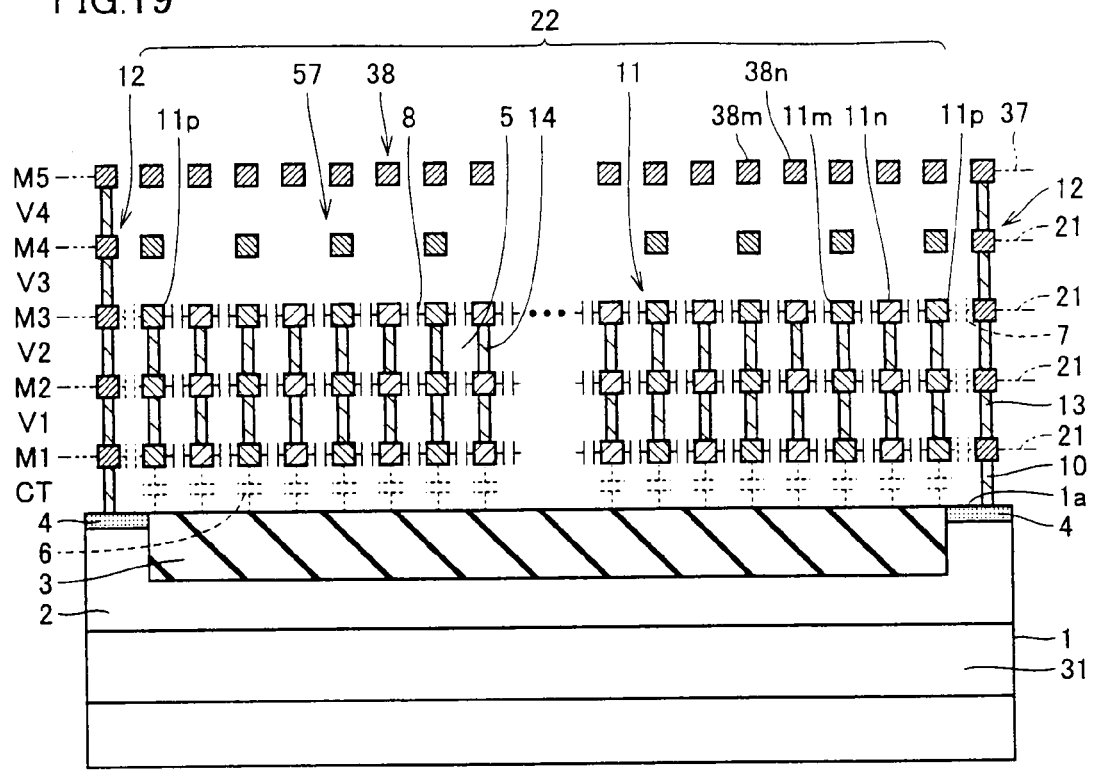

Referring to FIG. 19, in the present embodiment, a plurality of floating interconnections 57 are formed at a position in M4 layer sandwiched between interconnections 12 at both ends, corresponding to every other interconnection 11 therebelow. The plurality of floating interconnections 57 are not provided at a portion in which a parasitic capacitance may lead to deterioration of circuit accuracy (i.e., a portion to be a high impedance node when a circuit is implemented), and provided at a portion to be a low impedance node.

According to the semiconductor device with such a configuration, deterioration of accuracy in a high impedance node due to a parasitic capacitance can further be reduced as compared to the semiconductor device in the seventh embodiment. Furthermore, even in M4 layer in which floating interconnections 57 are thinned out compared to the case of FIG. 15, the area occupied by the interconnections is larger than in the case shown in FIG. 18, enabling to form more planar M5 layer on M4 layer.

Twelfth Embodiment

A semiconductor device in a twelfth embodiment of the present invention basically has a configuration similar to that of the semiconductor device in the fourth embodiment. Hereinafter, description of identical parts will not be repeated.

Figure 20:
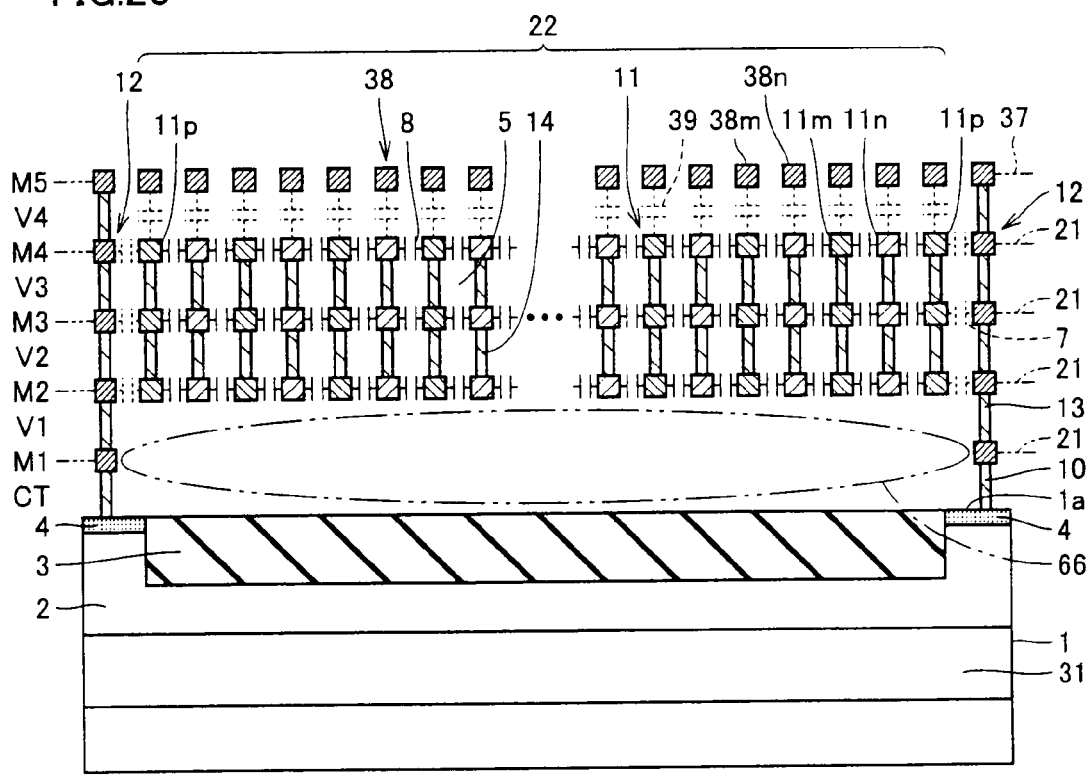

Referring to FIG. 20, in the present embodiment, no interconnections are provided in a position in M1 layer sandwiched between interconnections 12 at both ends (i.e., at a position surrounded by a chain double-dashed line 66), and the position is filled with insulating layer 5. Thus, the distance from main surface 1a of semiconductor substrate 1 to interconnection 11 adjacent to main surface 1a (i.e., interconnection 11 formed in M2 layer) is greater than the distance between vertically adjacent interconnections 11.

According to the semiconductor device with such a configuration, the effect similar to that described in the fourth embodiment can be obtained. In addition, by providing no interconnections in M1 layer and increasing the distance between interconnection 11 and main surface 1a, parasitic capacitance 6 formed between interconnection 11 and main surface 1a (see FIG. 9) can be reduced. Thus, a circuit using interconnection capacitance 8 can be implemented with higher accuracy.

Thirteenth Embodiment

A semiconductor device in a thirteenth embodiment of the present invention basically has a configuration similar to that of the semiconductor device in the eighth embodiment. Hereinafter, description of identical parts will not be repeated.

Figure 21:
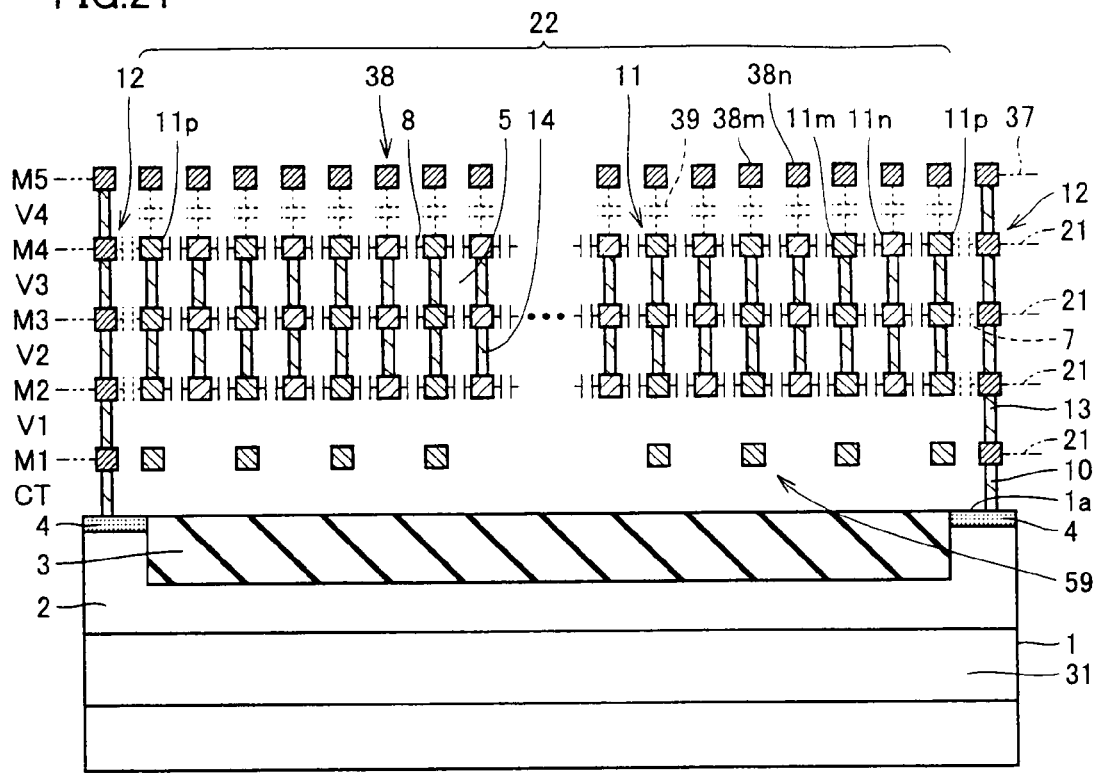

Referring to FIG. 21, in the present embodiment, a plurality of floating interconnections 59 are formed at a position in M1 layer sandwiched between interconnections 12 at both ends, corresponding to every other interconnection 11 therebelow. Floating interconnections 59 are not provided at a portion in which a parasitic capacitance may lead to deterioration of circuit accuracy (i.e., a portion to be a high impedance node when a circuit is implemented), and provided at a portion to be a low impedance node.

According to the semiconductor device with such a configuration, deterioration of accuracy in a high impedance node due to a parasitic capacitance can further be reduced as compared to the semiconductor device in the eighth embodiment. Furthermore, even in M1 layer in which floating interconnections 59 are thinned out compared to the case of FIG. 16, the area occupied by the interconnections is larger than in the case shown in FIG. 20, enabling to form more planar M2 layer on M1 layer.

Fourteenth Embodiment

A semiconductor device in a fourteenth embodiment of the present invention basically has a configuration similar to that of the semiconductor device in the fourth embodiment. Hereinafter, description of identical parts will not be repeated.

Figure 22:
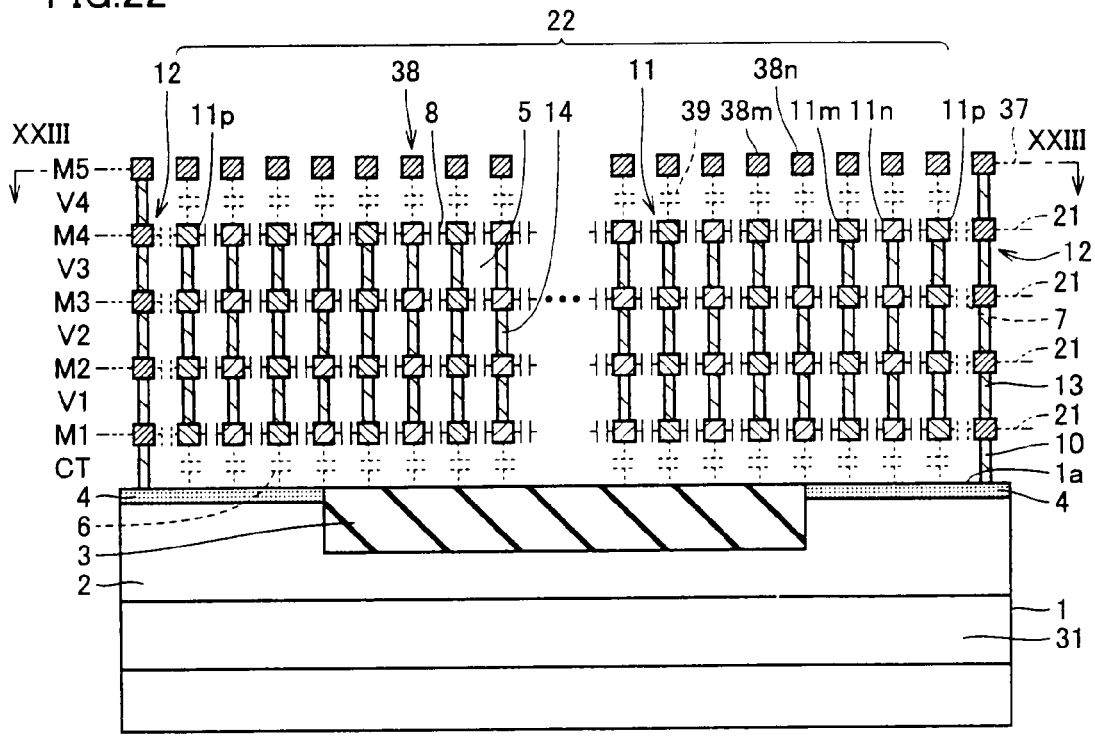
Figure 23:
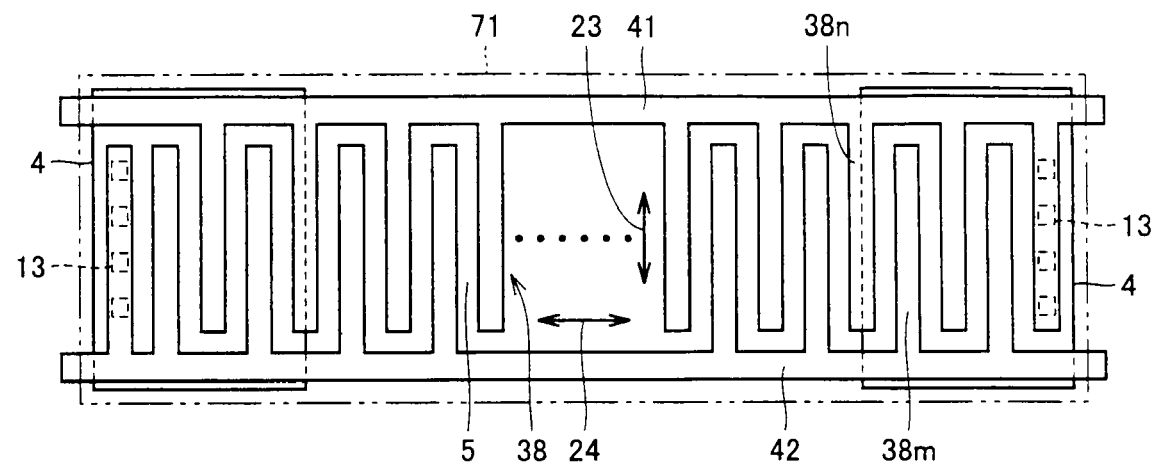
FIG. 23 is a plan view of the semiconductor device taken along the arrowed line in FIG. 22.

In FIG. 23, via hole 13 formed in V4 layer is shown by a dashed line. Referring to FIGS. 22 and 23, in the present embodiment, the area ratio of active region 4 to a region 71 on main surface 1a immediately above which interconnections 11 and 12 are formed satisfies a predetermined occupied area ratio.

Here, a "predetermined occupied area ratio" refers to an area ratio of a specific region defined to produce planar main surface 1a through the manufacturing process of a semiconductor device (including an active region formed by introducing impurities into main surface 1a, and a region in which a polysilicon film is formed in contact with main surface 1a). The predetermined occupied area ratio is, for example, not less than 25%, not less than 50%, or not less than 75%.

The semiconductor device in the fourteenth embodiment of the present invention includes active region 4 as the specific region defined in main surface 1a. The area ratio of active region 4 to region 71 on main surface 1a immediately above which interconnections 11 and 12 are formed is not less than a predetermined value.

According to the semiconductor device with such a configuration, the effect similar to that described in the fourth embodiment can be obtained. In addition, since active region 4 is formed to satisfy a predetermined occupied area ratio, a planar film (insulating layer 5 in the present embodiment) can be formed on main surface 1a. Accordingly, interconnections 11 and 12 can be formed on the planar film, and thus interconnections 11 and 12 can be finished in a more uniform configuration.

Fifteenth Embodiment

A semiconductor device in a fifteenth embodiment of the present invention basically has a configuration similar to that of the semiconductor device in the fourteenth embodiment. Hereinafter, description of identical parts will not be repeated.

Figure 24:
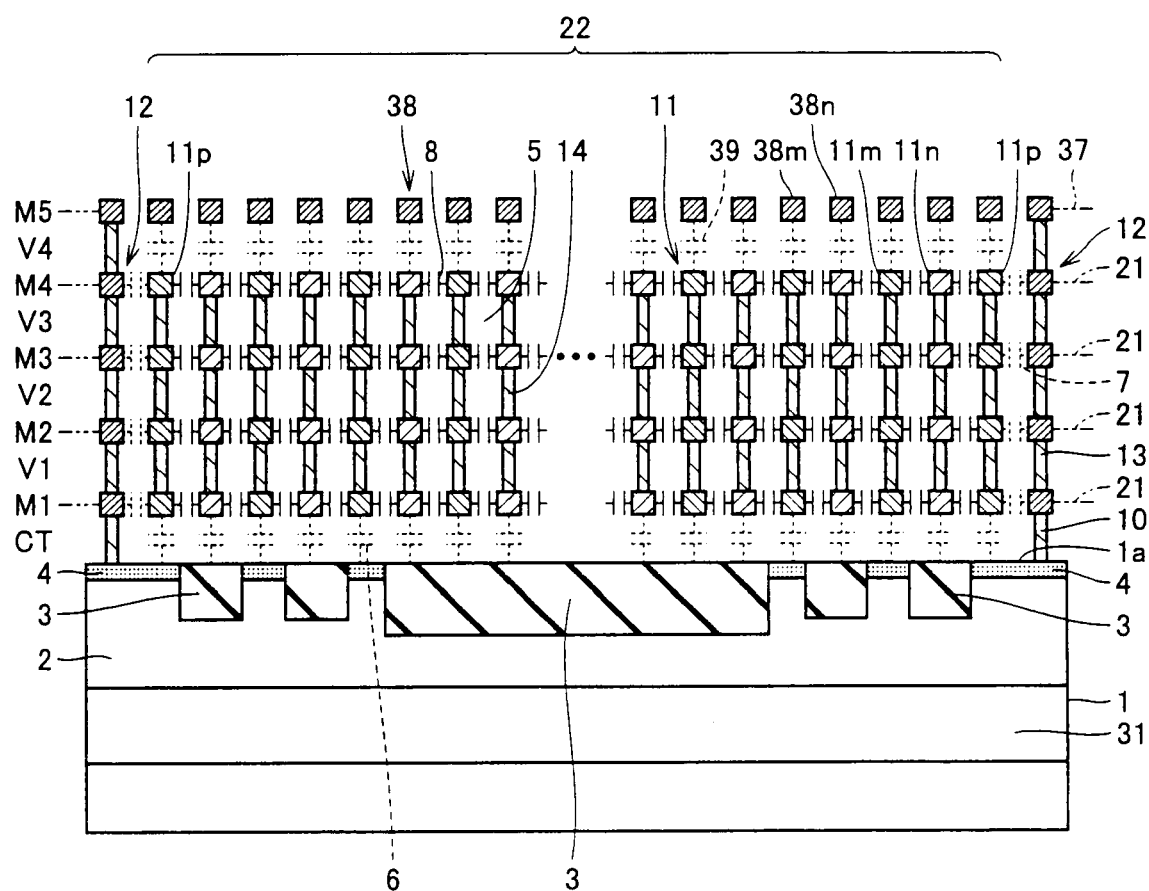
FIGS. 24 and 25 are cross-sectional views showing semiconductor devices in fifteenth and sixteenth embodiments of the present invention, respectively.

Referring to FIG. 24, in the present embodiment, isolating oxide film 3 is additionally formed at a position in main surface 1a in which active region 4 has been formed in FIG. 22. Isolating oxide film 3 is located immediately below interconnection 11n having relatively high impedance. In contrast, active region 4 is located immediately below interconnection 11m having relatively low impedance.

According to the semiconductor device with such a configuration, the effect similar to that described in the fourteenth embodiment can be obtained. In addition, the influence of parasitic capacitance 6 formed between main surface 1a and interconnection 11n connected to a high impedance node can be reduced.

Sixteenth Embodiment

A semiconductor device in a sixteenth embodiment of the present invention basically has a configuration similar to that of the semiconductor device in the fifteenth embodiment. Hereinafter, description of identical parts will not be repeated.

Figure 25:
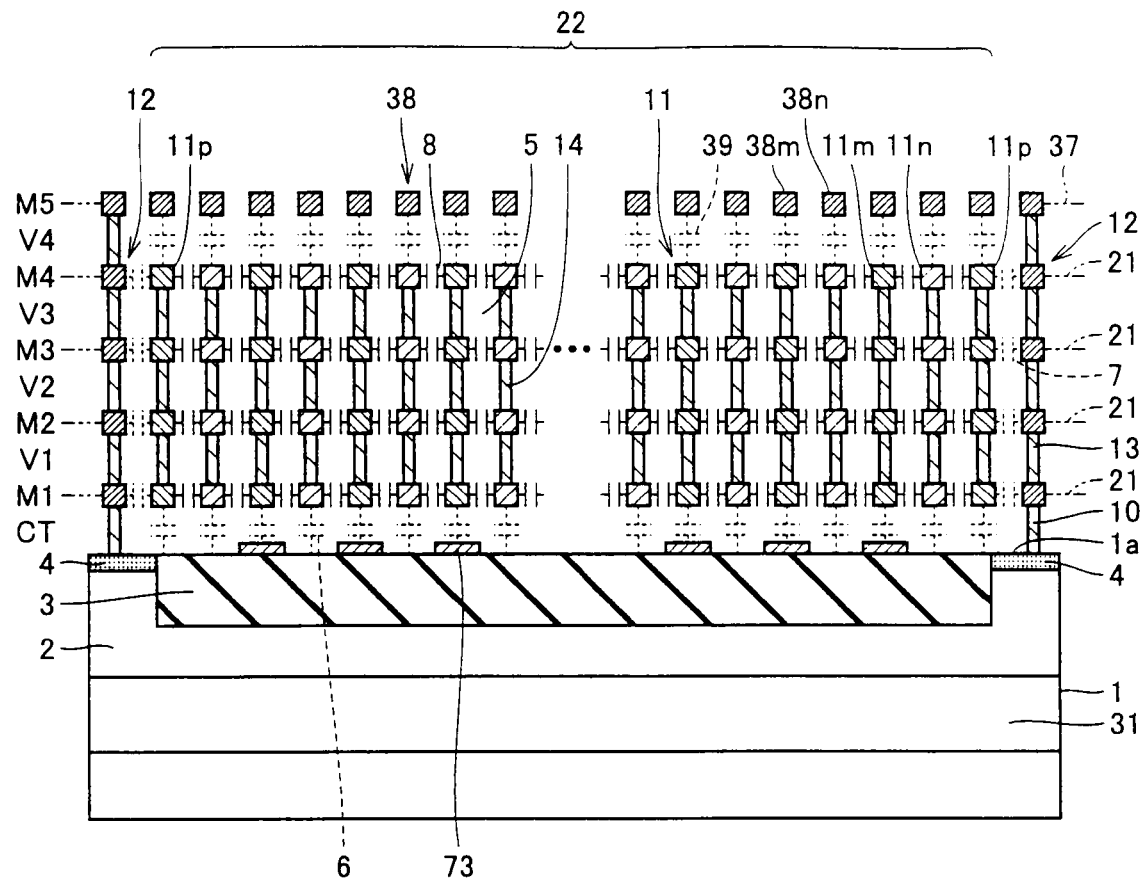

Referring to FIG. 25, in the present embodiment, a polysilicon film 73 is formed immediately below interconnection 11m having relatively low impedance, and isolating oxide film 3 is formed immediately below interconnection 11n having relatively high impedance.

According to the semiconductor device with such a configuration, the effect similar to that described in the fifteenth embodiment can also be obtained.

Seventeenth Embodiment

Figure 26:
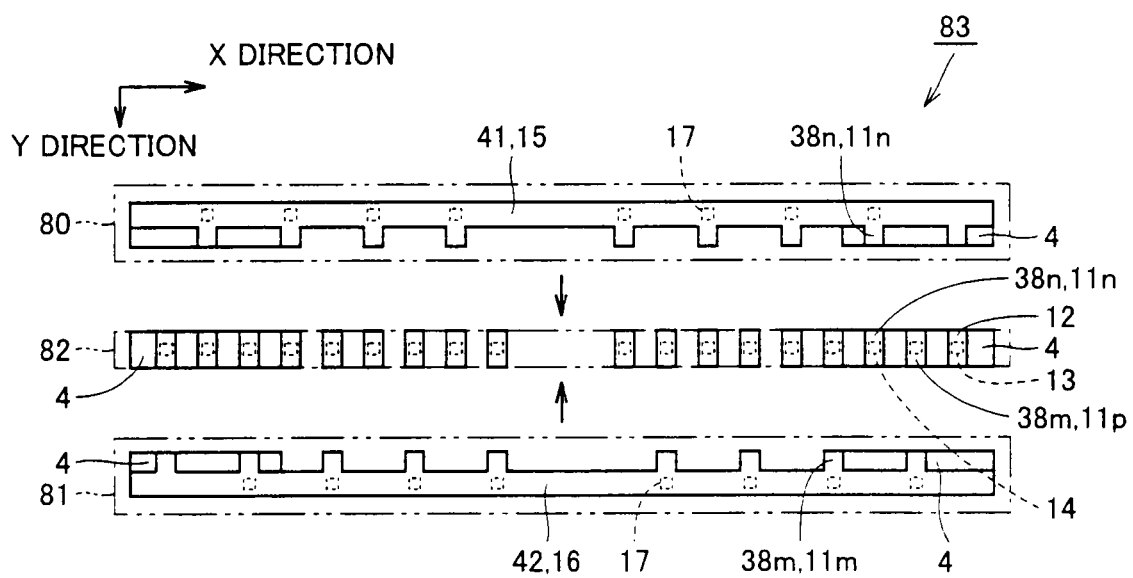
FIG. 26 is a plan view showing a semiconductor device manufactured according to a method of designing a semiconductor device in a seventeenth embodiment of the present invention.

Referring to FIG. 26, a semiconductor device 83 according to a seventeenth embodiment of the present invention has a configuration in which drawing terminal cells 80 and 81 and a unit capacitance cell 82 located between drawing terminal cells 80 and 81 are combined in a Y direction. Drawing terminal cells 80 and 81 include the interconnection configuration of interconnections 41 and 42 in the semiconductor device shown in FIG. 10, and unit capacitance cell 82 includes the interconnection configuration having a predetermined width between interconnection 41 and interconnection 42. The length of drawing terminal cells 80 and 81 and unit capacitance cell 82 in an X direction is determined to satisfy the predetermined occupied area ratio described in the fourteenth embodiment.

Figure 27:
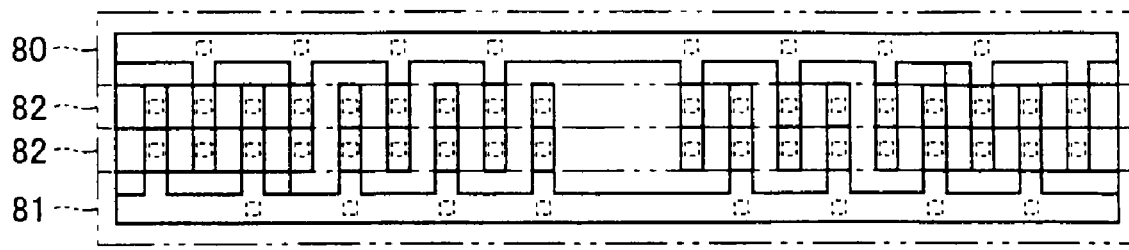
FIGS. 27 to 30 are plan views showing variations of the semiconductor device shown in FIG. 26.
Figure 28:
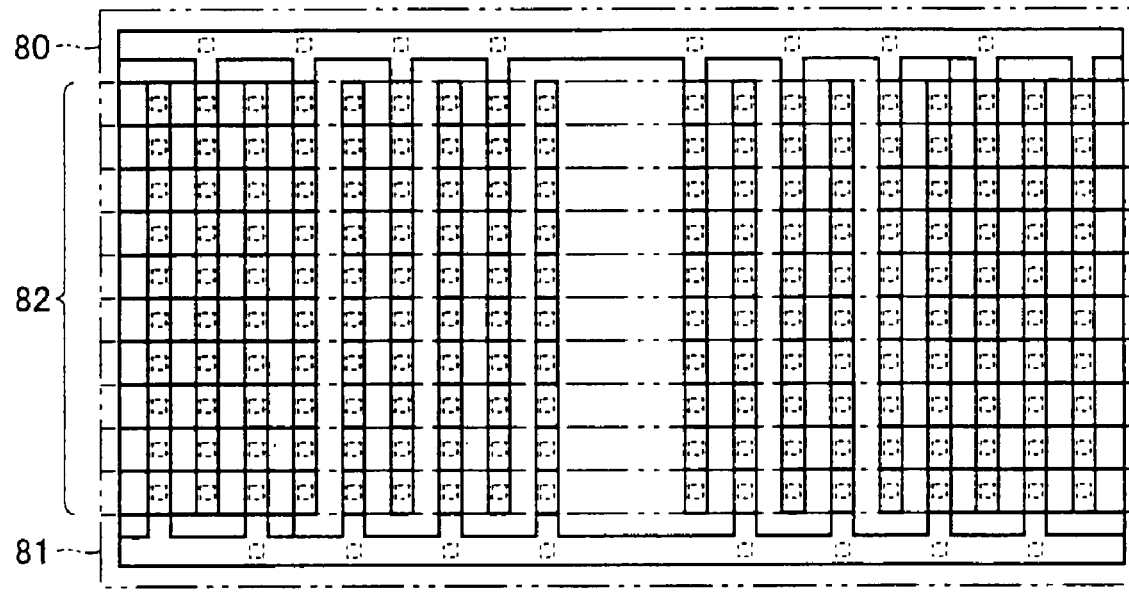

FIGS. 27 to 30 show variations of the semiconductor device in FIG. 26. Referring to FIG. 27, a semiconductor device 84 has a configuration in which drawing terminal cells 80 and 81 and two unit capacitance cells 82 located between drawing terminal cells 80 and 81 are combined in the Y direction. Referring to FIG. 28, a semiconductor device 85 has a configuration in which drawing terminal cells 80 and 81 and 10 unit capacitance cells 82 located between drawing terminal cells 80 and 81 are combined in the Y direction.

Figure 29:
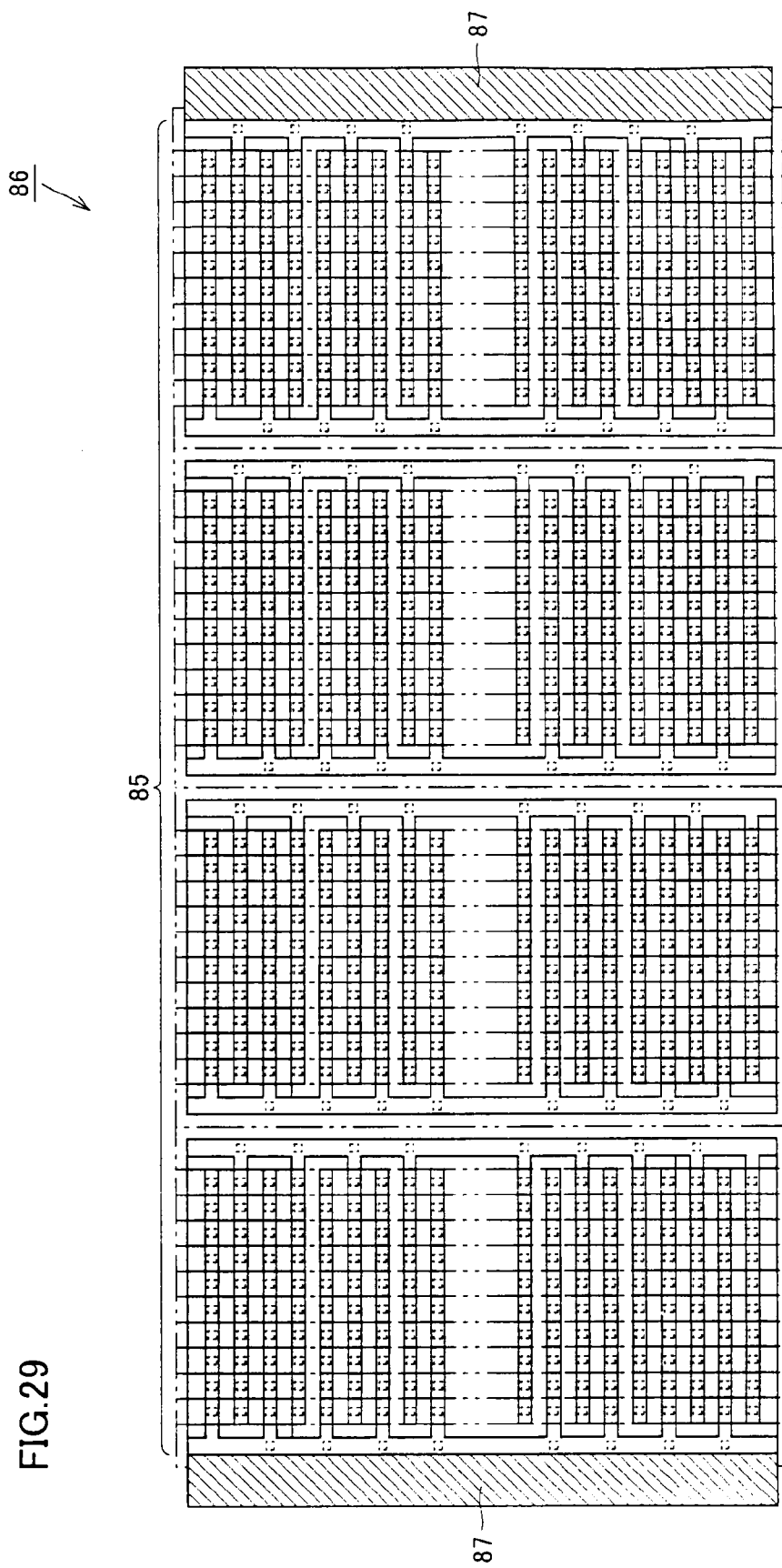

Referring to FIG. 29, a semiconductor device 86 has a configuration in which four semiconductor devices 85 shown in FIG. 28 are connected in parallel, and a polysilicon layer 87 extending in a band shape is located on its either side. Polysilicon layer 87 is provided to guarantee a sufficient occupied area ratio in such a case where there is no gate layer in the periphery of the capacitance forming region.

Figure 30:
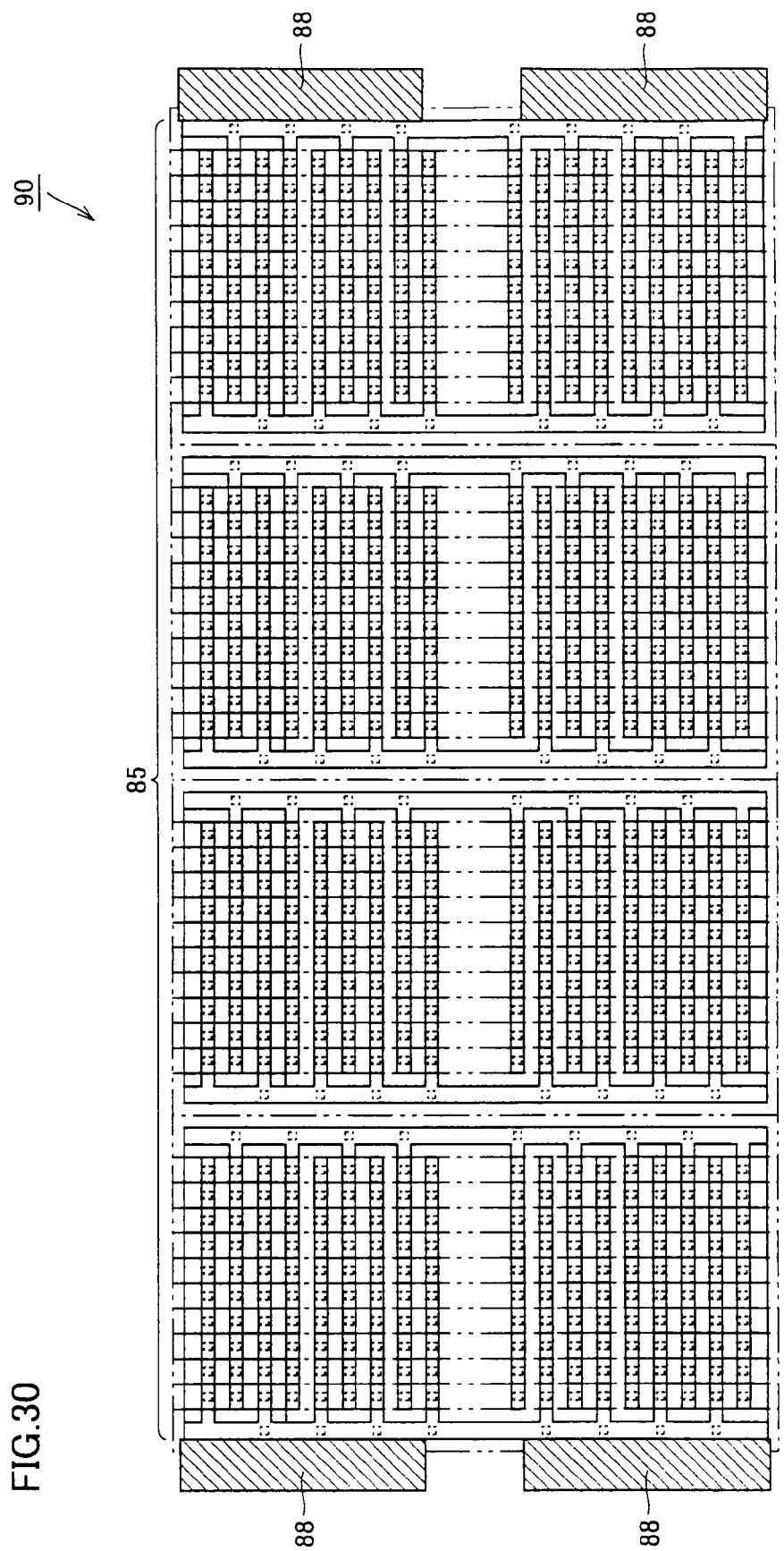

Referring to FIG. 30, a semiconductor device 90 has a configuration substantially similar to that of semiconductor device 86 in FIG. 29, except that two polysilicon layers 88, extending in a band shape and divided in the middle, are located on its either side. Polysilicon layers 88 divided to have an appropriate size are used when polysilicon layer 87 shown in FIG. 29 would provide too high an occupied area ratio.

A method of designing the semiconductor device in the seventeenth embodiment of the present invention utilizes the semiconductor devices described in the fourteenth to the sixteenth embodiments. The method of designing the semiconductor device includes the steps of unitizing the semiconductor device as a unit capacitance cell, and combining a plurality of such unit capacitance cells.

According to the method of designing the semiconductor device with such a configuration, since the cells satisfying a predetermined occupied area ratio are combined to determine the configuration of the semiconductor device, the semiconductor device also always satisfies the predetermined occupied area ratio as a whole. This makes it possible to design a semiconductor device satisfying a predetermined occupied area ratio without going through a complicated design process. With this method, a semiconductor device having an interconnection capacitance with small fluctuations during processing can be obtained.

The embodiments described above may be combined as appropriate to form the semiconductor device in accordance with the present invention, and in that case, the effects similar to those described in the combined embodiments can be obtained. For example, when the configuration satisfying the occupied area ratio shown in FIG. 22 is applied to the semiconductor device shown in FIG. 13, the effects described in the fifth and the fourteenth embodiments can be achieved.

According to the present invention, a semiconductor device having a capacitive element for which external electrical interference is sufficiently reduced and offering a desired characteristic can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a semiconductor substrate including a main surface;
a plurality of first interconnections formed in a predetermined region on said main surface and extending in a predetermined direction, one end of each of said plurality of first interconnections connecting to a second interconnection;
a plurality of third interconnections formed in said predetermined region and extending in said predetermined direction, one end of each of said plurality of third interconnections connecting to a fourth interconnection; and
a fifth interconnection located at an edge of said predetermined region, and extending in said predetermined direction,
wherein said plurality of first interconnections and said plurality of third interconnections are located in a first plane parallel to said main surface,
said second interconnection, said fourth interconnection and said fifth interconnection are located in said first plane,
one side of each of said plurality of first interconnections faces each of said plurality of third interconnections, and another side of each of said plurality of first interconnections faces each of said plurality of third interconnections,
an insulating layer is formed on said main surface and fills in between each of said plurality of first interconnections, between each of said plurality of third interconnections, and between one of said plurality of first interconnections and said plurality of third interconnections and said fifth interconnection adjacent to each other,
said plurality of first interconnections, said plurality of third interconnections, and said fifth interconnection are located in a direction substantially perpendicular to said predetermined direction,
a capacitance is formed by said plurality of first interconnections, said second interconnection, said plurality of third interconnections, said fourth interconnection and said insulating layer formed between each of said plurality of first interconnections and each of said plurality of third interconnections,
said plurality of first interconnections and said second interconnection are one of electrodes of said capacitance, said plurality of third interconnections and said fourth interconnection are the other of said electrodes of said capacitance,
a plurality of polysilicon films are formed in said predetermined region between said semiconductor substrate and said first plane, and
each of the first, second, third, fourth, and fifth interconnections includes a copper metal,
said semiconductor substrate includes a first well layer of a first conductivity type extending in said main surface, said fifth interconnection electrically connected to said first well layer,
said first well layer being fixed at one of a ground potential and a power supply potential.

2. The semiconductor device according to claim 1, wherein said plurality of first interconnections, said second interconnection, said plurality of third interconnections, said fourth interconnection and said fifth interconnection are formed in a plurality of said first planes spaced apart from each other, and
in plan view, each of said plurality of first interconnections in said first plane overlaps each of said plurality of third interconnections in said first plane adjacent to said first plane.

3. The semiconductor device according to claim 1, wherein a plurality of active regions and a plurality of isolation regions are formed in said predetermined region in said semiconductor substrate, and
said plurality of polysilicon films are formed at least on said plurality of active regions or said plurality of isolation regions.

4. The semiconductor device according to claim 1, wherein said semiconductor substrate further includes a second well layer of a second conductivity type extending parallel to said first well layer at a position immediately below said predetermined region and apart from said main surface,
said second well layer being fixed at a potential different from the one of the ground potential and the power supply potential at which said first well layer is fixed.

5. The semiconductor device according to claim 1, wherein the fifth interconnections are plural, and
said plurality of first interconnections and said plurality of third interconnections are formed between said plurality of fifth interconnections.

6. The semiconductor device according to claim 1, wherein the plurality of polysilicon films are not electrodes of the capacitance.

7. A semiconductor device, comprising:
a semiconductor substrate including a main surface;
a plurality of first interconnections formed in a predetermined region on said main surface and extending in a predetermined direction, one end of each of said plurality of first interconnections connecting to a second interconnection;
a plurality of third interconnections formed in said predetermined region and extending in said predetermined direction, one end of each of said plurality of third interconnections connecting to a fourth interconnection; and
a fifth interconnection located at an edge of said predetermined region and extending in said predetermined direction,
wherein said plurality of first interconnections and said plurality of third interconnections are located in a first plane parallel to said main surface,
said second interconnection, said fourth interconnection and said fifth interconnection are located in said first plane,
one side of each of said plurality of first interconnections faces each of said plurality of third interconnections, and another side of each of said plurality of first interconnections faces each of said plurality of third interconnections,
an insulating layer is formed on said main surface and fills in between each of said plurality of first interconnections, between each of said plurality of third interconnections, and between one of said plurality of first interconnections and said plurality of third interconnections and said fifth interconnection adjacent to each other,
said plurality of first interconnections, said plurality of third interconnections, and said fifth interconnection are located in a direction substantially perpendicular to said predetermined direction,
a capacitance is formed by said plurality of first interconnections, said second interconnection, said plurality of third interconnections, said fourth interconnection and said insulating layer formed between each of said plurality of first interconnections and each of said plurality of third interconnections,
said plurality of first interconnections and said second interconnection are one of electrodes of said capacitance, said plurality of third interconnections and said fourth interconnection are the other of said electrodes of said capacitance,
a polysilicon film is formed in said predetermined region between said semiconductor substrate and said first plane,
a plurality of active regions and a plurality of isolation regions are formed in said predetermined region in said semiconductor substrate,
said polysilicon film is formed at least on said plurality of active regions or said plurality of isolation regions, and
each of the first, second, third, fourth, and fifth interconnections includes a copper metal,
said semiconductor substrate includes a first well layer of a first conductivity type extending in said main surface,
said fifth interconnection electrically connected to said first well layer,
said first well layer being fixed at one of a ground potential and a power supply potential.

8. The semiconductor device according to claim 7, wherein said plurality of first interconnections, said second interconnection, said plurality of third interconnections, said fourth interconnection and said fifth interconnection are formed in a plurality of said first planes spaced apart from each other, and
in plan view, each of said plurality of first interconnections in said first plane overlaps each of said plurality of third interconnections in said first plane adjacent to said first plane.

9. The semiconductor device according to claim 8, wherein the polysilicon film is not an electrode of the capacitance.

10. The semiconductor device according to claim 7, wherein in cross sectional view, each of said plurality of active regions and each of said plurality of isolation regions is arranged alternately to each other.

11. The semiconductor device according to claim 7, wherein
said semiconductor substrate further includes a second well layer of a second conductivity type extending parallel to said first well layer at a position immediately below said predetermined region and apart from said main surface,
said second well layer being fixed at a potential different from the one of the ground potential and the power supply potential at which said first well layer is fixed.

12. The semiconductor device according to claim 7, wherein
the fifth interconnections are plural, and
said plurality of first interconnections and said plurality of third interconnections are formed between said plurality of fifth interconnections.

13. A semiconductor device, comprising:
a semiconductor substrate including a main surface; and
a plurality of capacitance units,
each of the plurality of capacitance units comprising:
a plurality of first interconnections formed in a predetermined region on said main surface and extending in a predetermined direction, one end of each of said plurality of first interconnections connecting to a second interconnection;
a plurality of third interconnections formed in said predetermined region and extending in said predetermined direction, one end of each of said plurality of third interconnections connecting to a fourth interconnection,
a fifth interconnection located at an edge of said predetermined region and extending in said predetermined direction,
wherein said plurality of first interconnections, said plurality of third interconnections and said fifth interconnection are located in a first plane parallel to said main surface, said second interconnection, said fourth interconnection and said fifth interconnection are located in said first plane, one side of each of said plurality of first interconnections faces each of said plurality of third interconnections, and another side of each of said plurality of first interconnections faces each of said plurality of third interconnections, an insulating layer is formed on said main surface and fills in between each of said plurality of first interconnections, between each of said plurality of third interconnections, and between one of said plurality of first interconnections and said plurality of third interconnections and said fifth interconnection adjacent to each other, said plurality of first interconnections and said plurality of third interconnections are located in a direction substantially perpendicular to said predetermined direction, a capacitance is formed by said plurality of first interconnections, said second interconnection, said plurality of third interconnections, said fourth interconnection and said insulating layer formed between each of said plurality of first interconnections and each of said plurality of third interconnections, the capacitance including the plurality of capacitance units, said plurality of first interconnections and said second interconnection of each of the plurality of capacitance units are one of electrodes of said capacitance, and said plurality of third interconnections and said fourth interconnection of each of the plurality of capacitance units are the other of said electrodes of said capacitance, a plurality of predetermined polysilicon films are located at an edge of the plurality of capacitance units, and each of the first, second, third, fourth, and fifth interconnections includes a copper metal, said semiconductor substrate includes a first well layer of a first conductivity type extending in said main surface, said fifth interconnection electrically connected to said first well layer, said first well layer being fixed at one of a ground potential and a power supply potential.

14. The semiconductor device according to claim 13, wherein a plurality of conductive films are formed in said predetermined region between said semiconductor substrate and said first plane.

15. The semiconductor device according to claim 14, wherein a plurality of active regions and a plurality of isolation regions are formed in said predetermined region in said semiconductor substrate, and said plurality of conductive films are formed at least on said plurality of active regions or said plurality of isolation regions.

16. The semiconductor device according to claim 15, wherein in cross sectional view, each of said plurality of active regions and each of said plurality of isolation regions is arranged alternately to each other.

17. The semiconductor device according to claim 14, wherein said conductive film is a polysilicon film.

18. The semiconductor device according to claim 13, wherein said plurality of first interconnections, said second interconnection, said plurality of third interconnections, said fourth interconnection and said fifth interconnection are formed in a plurality of said first planes spaced apart from each other, in plan view, each of said plurality of first interconnections in said first plane overlaps each of said plurality of third interconnections in said first plane adjacent to said first plane.

19. The semiconductor device according to claim 13, wherein said semiconductor substrate further includes a second well layer of a second conductivity type extending parallel to said first well layer at a position immediately below said predetermined region and apart from said main surface, said second well layer being fixed at a potential different from the one of the ground potential and the power supply potential at which said first well layer is fixed.

20. The semiconductor device according to claim 13, wherein the fifth interconnections are plural, and said plurality of first interconnections and said plurality of third interconnections are formed between said plurality of fifth interconnections.

* * * * *